United States Patent [19]

Moxley

[11] 4,426,688
[45] Jan. 17, 1984

[54] MEMORY SYSTEM HAVING AN ALTERNATE MEMORY

[75] Inventor: David C. Moxley, Irmo, S.C.
[73] Assignee: NCR Corporation, Dayton, Ohio
[21] Appl. No.: 289,640
[22] Filed: Aug. 3, 1981
[51] Int. Cl.³ .............................................. G11C 13/00
[52] U.S. Cl. .................................................. 365/200
[58] Field of Search ........................................ 365/200

[56] References Cited
U.S. PATENT DOCUMENTS 3,350,690 10/1967 Rice ..................................... 365/200
3,434,116 3/1969 Anacker .............................. 365/200

Primary Examiner—James W. Moffitt
Attorney, Agent, or Firm—Stephen F. Jewett; Robert L. Clark

[57] ABSTRACT

A memory system having both a primary memory and an alternate memory. The alternate memory stores data to be substituted for data stored at memory locations in the primary memory that have defective cells. The alternate memory includes a byte memory and a bit memory. The byte memory stores bytes of data that are to replace bytes having multiple bit errors in the primary memory. The bit memory stores bits to replace single bits in any byte in the primary memory that has a single bit error. A mapping memory controls access to the primary memory and the alternate memory. The memory devices in the primary memory have either all row defects or all column defects in order to reduce the size of the mapping memory.

12 Claims, 22 Drawing Figures

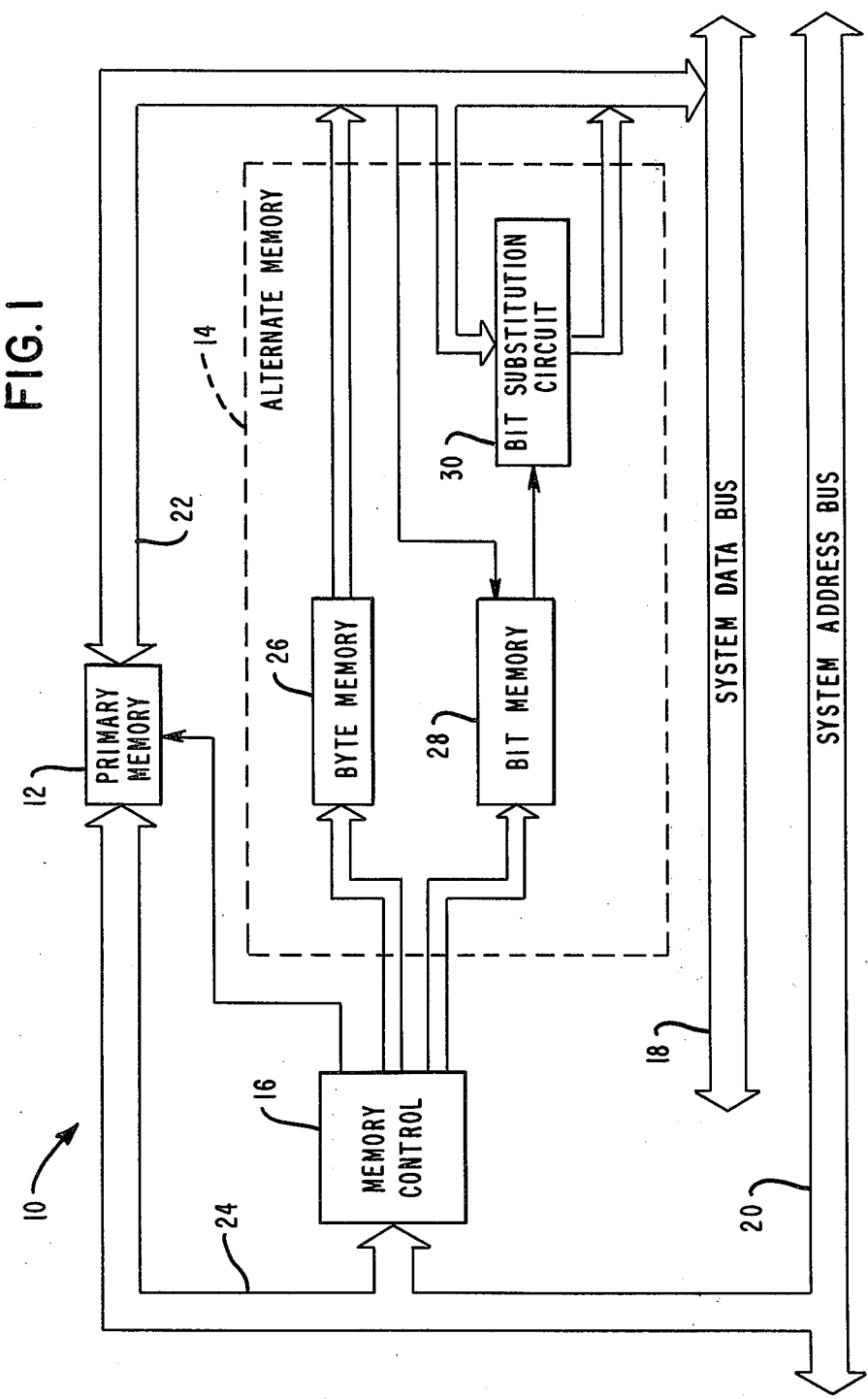

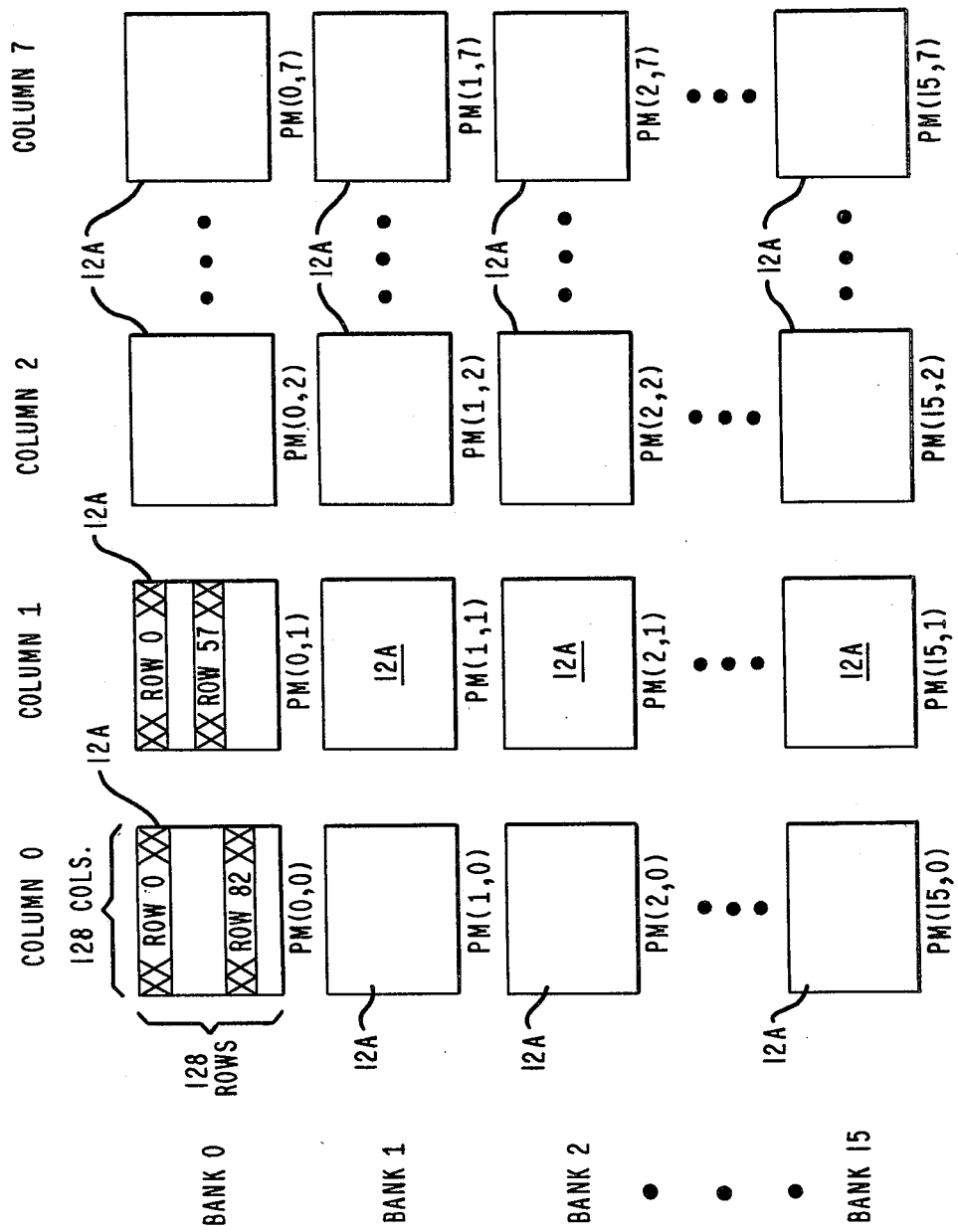

FIG. 4

| | MA15 | MA14 | MA13 | MA12 | MA11 | MA10 | MA9 | MA8 | MA7 | MA6 | MA5 | MA4 | MA3 | MA2 | MA1 | MA0 |
|---|---|---|---|---|---|---|---|---|---|---|---|---|---|---|---|---|
| NO ERROR | X | X | X | X | — | — | — | X | X | X | X | X | X | X | X | X |
| SINGLE BIT ERROR | X | SELECT BIT TO OR FROM BIT MEMORY (3 BITS) | | | 0 | CHIP SELECT FOR BIT MEMORY (3 BITS) | | | X | COLUMN ADDRESS FOR BIT MEMORY (7 BITS) | | | | | | |
| MULTIPLE BIT ERRORS | X | X | X | X | — | CHIP SELECT FOR BYTE MEMORY (3 BITS) | | | X | X | X | X | PORTION OF ADDRESS FOR BYTE MEMORY (3 BITS) | | | |

X — DON'T CARE

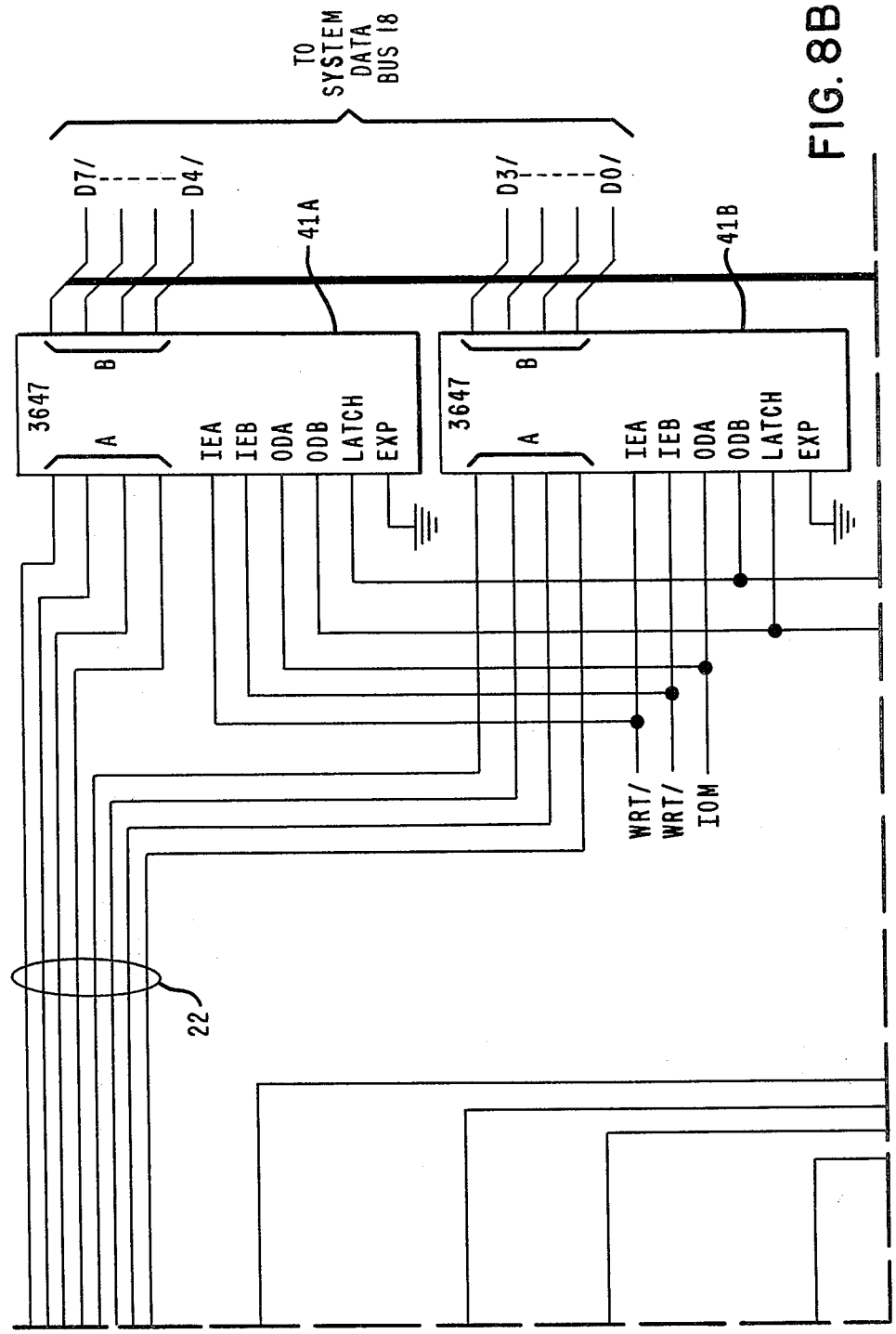

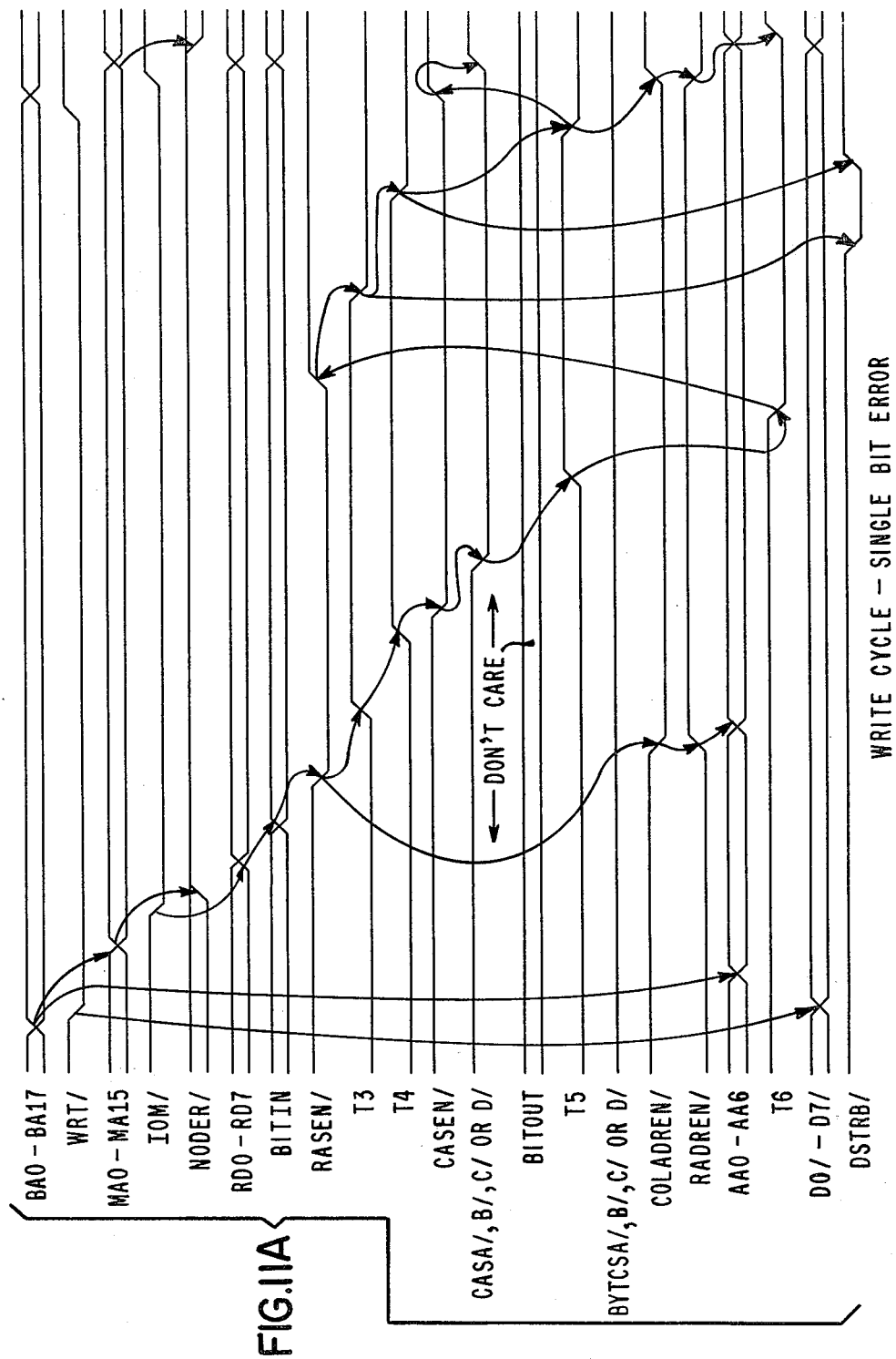
FIG.11A WRITE CYCLE – SINGLE BIT ERROR

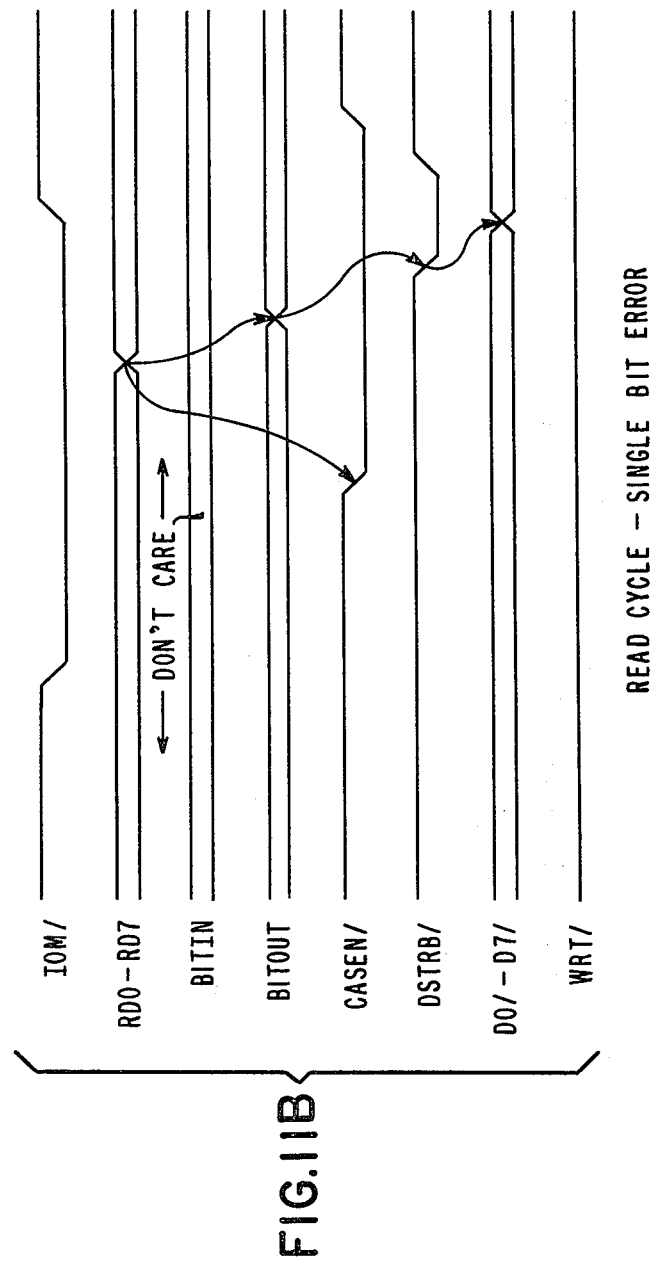

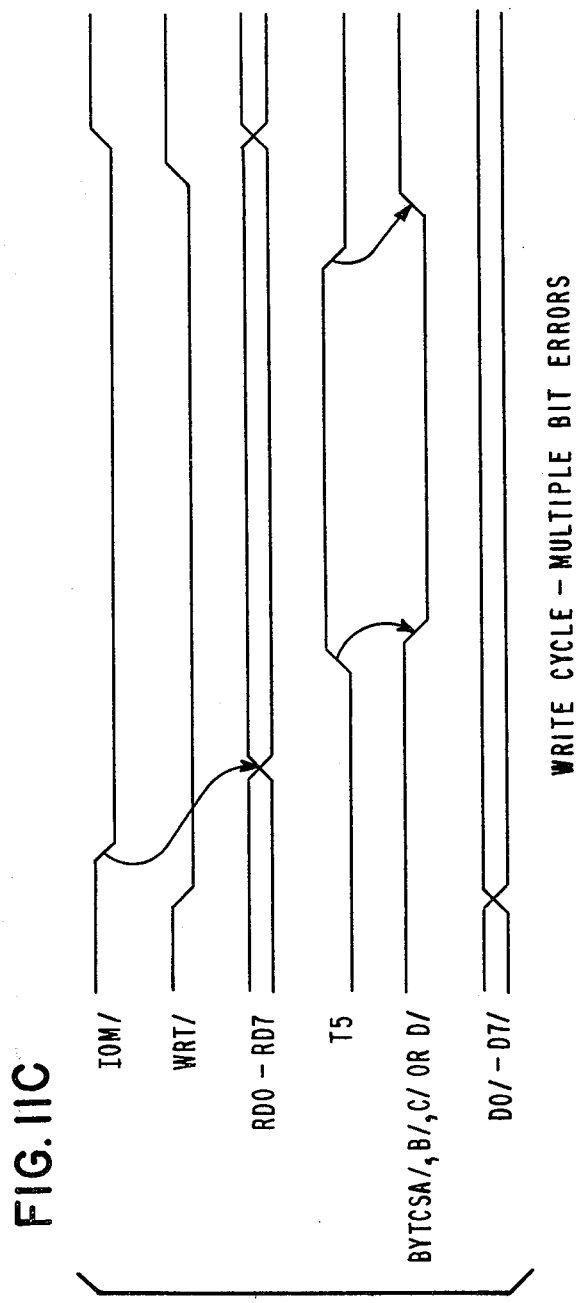

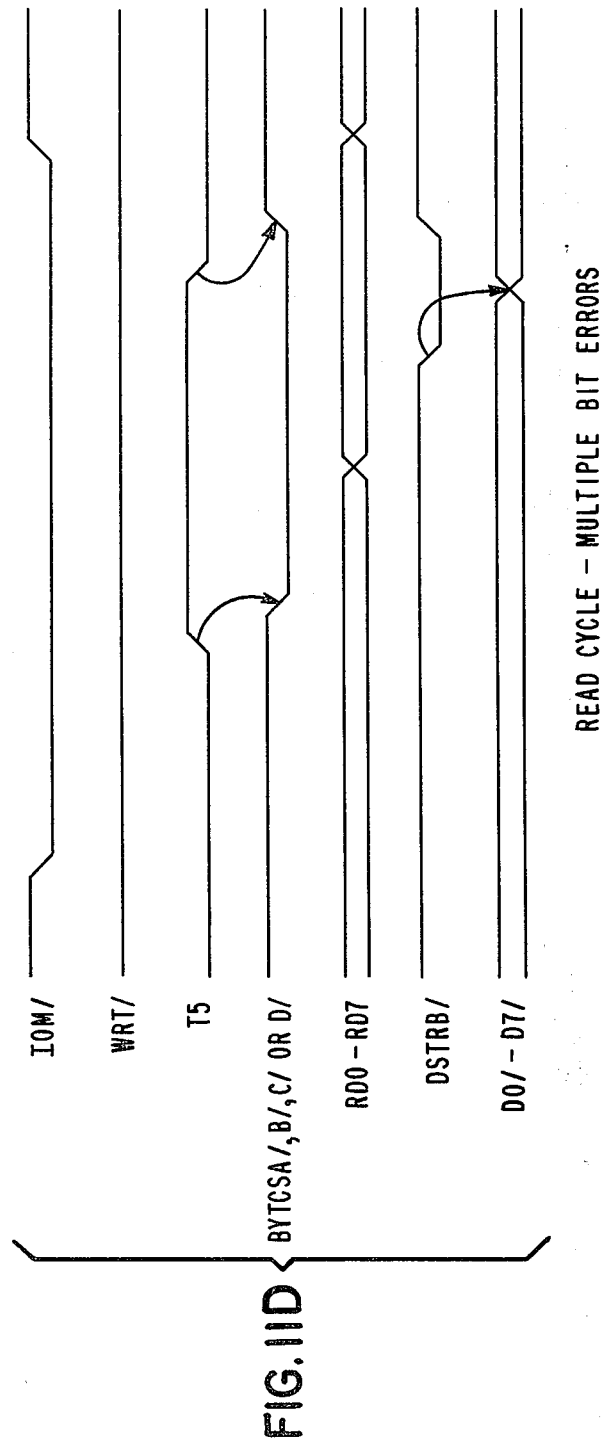

MEMORY SYSTEM HAVING AN ALTERNATE MEMORY

BACKGROUND OF THE INVENTION

The present invention relates to data processing systems and, more particularly, to a data processing system of the type having a memory system with a back-up or alternate memory.

One of the most troublesome problems facing the computer industry is the occurrence of faults or defects in integrated circuit chips. Such defects substantially affect the reliability and cost of computer systems, since modern computer systems are largely constructed from integrated circuits.

In the past, one approach to overcoming the problems posed by defective integrated circuit chips has been to maintain strict quality control measures in order to detect those chips that have faults or defects. The defective chips can be separated from the non-defective chips and discarded. The price that one pays for each of the remaining good chips that is free of defects usually depends on the yield obtained by the chip manufacturer. If the yield is good, with very few chips having defects, the price per chip may be low. However, if the yield is poor, with most of the manufactured chips having defects, the price for one of the few good chips will be relatively high.

Particular problems are faced in the case of integrated circuits that are used to construct a memory system, since defects can occur at storage or memory cells and can prevent data from being reliably stored at such defective cells. A bit error would normally occur in the data stored at each defective cell.

It has been proposed in the past to use memory devices or chips having defective cells in a primary memory by providing a back-up or alternate memory. The alternate memory stores data that would otherwise be stored at the defective cell locations in the memory chips of the primary memory. Circuitry is provided for accessing data in the alternate memory so that when data is to be read from the defective cells in the primary memory, the data in the alternate memory is substituted in its place.

One drawback to systems employing alternate memories is the additional cost associated with the alternate memory. The need for additional memory or memory chips for the alternate memory increases the cost of the memory system and it may not be any less expensive than using only higher-priced good memory chips. In particular, since a bit addressable alternate memory requires a large number of address lines and would need to be accessed several times when a word having multiple bit errors is accessed in the primary memory, it has been found necessary to construct the alternate memory so that it will store an entire data word or byte to replace each data word or byte in the primary memory that has one or more bit errors. As a result, in a primary memory having a fairly significant number of cell defects, the size and cost of the alternate memory may need to be large.

SUMMARY OF THE INVENTION

There is provided, in accordance with the present invention, a memory system having a primary memory and an alternate memory. The primary memory has defective memory cells and the alternate memory stores data to replace the data in the primary memory that has bit errors due to being stored at the defective cells. In particular, the alternate memory is comprised of a first alternate memory portion having a plurality of addressable memory locations, each memory location for storing a first predetermined number of bits, and a second alternate memory portion having a plurality of addressable memory locations, each memory location in the second alternate memory portion for storing a second predetermined number of bits that is less than the first number in each memory location of the first alternate memory portion.

By providing the number of bits in the first and second alternate memory portions of different size, the amount of memory space required in the alternate memory for storing replacement data is considerably reduced over an alternate memory having, say, only a byte memory. However, the memory system having an alternate memory in accordance with the present invention still has a high speed of replacement when there are multiple bit errors, since the bytes or words from the primary memory having larger numbers of bit errors can be replaced by the data in the first alternate memory portion having the larger number of bits in its memory locations, and the bytes or words in the primary memory having a smaller number of bit errors can be replaced by the data in the second alternate memory portion having the smaller number of bits in its memory locations. The result is an alternate memory having both a high speed of replacement and, yet, a significantly lower cost than an alternate memory having only a byte addressable memory.

In the described preferred embodiment, the memory system includes a primary memory and an alternate or backup memory that has both a first memory portion or byte memory and a second memory portion or bit memory. The primary member is byte addressable, and when a byte is addressed that has multiple bit errors (i.e., a byte addressed at a memory location that has multiple cell defects), the byte memory of the alternate memory is accessed to provide a replacement byte of data. When a byte in the primary memory is addressed that has a single bit error (i.e., a byte addressed at a memory location that has a single cell defect), the bit memory is addressed to provide a single replacement bit. Bit substitution circuitry is provided at the output of the bit memory in order to receive an entire byte of data having a single bit error from the primary memory, and substituting the replacement bit from the bit memory for the bit in error.

A mapping memory is provided for storing a control word associated with each byte in the primary memory that has either a single or multiple bit error. Each control word specifies a memory location in either the byte memory or the bit memory at which the replacement data is stored.

In addition, the primary memory in the described preferred embodiment is constructed from memory chips with either "all row" or "all column" defects. As a result of such construction, the required memory space in the mapping memory is considerably reduced.

It is, therefore, an object of the present invention to provide an improved memory system.

It is another object of the present invention to provide an improved memory system that includes a primary memory and an alternate memory.

It is still another object of the present invention to provide an improved memory system that may include memory devices with defective memory cells.

It is still another object of the present invention to provide a memory system with an alternate memory that requires a reduced amount of memory space.

These and other objects of the present invention will become apparent from the following detailed description, as illustrated in the accompanying drawings, wherein like reference numbers indicate like parts.

BRIEF DESCRIPTION OF THE DRAWINGS

FIG. 1 is a simplified block diagram of a memory system in accordance with the present invention.

FIG. 3 is a diagram illustrating the arrangement of memory devices in the primary memory seen in FIGS. 1 and 2B.

FIG. 4 is a table illustrating the format of the control words stored in the mapping memory seen in FIG. 2A.

FIGS. 8A-8D are a detailed circuit diagram of the bit substitution circuit and associated circuitry in the memory system of FIG. 2A and 2B.

FIGS. 11A, 11B, 11C and 11D are timing diagrams illustrating the various signals occurring during operation of the circuitry of FIGS. 5A-10.

DETAILED DESCRIPTION OF THE PREFERRED EMBODIMENT

Figure 2A:
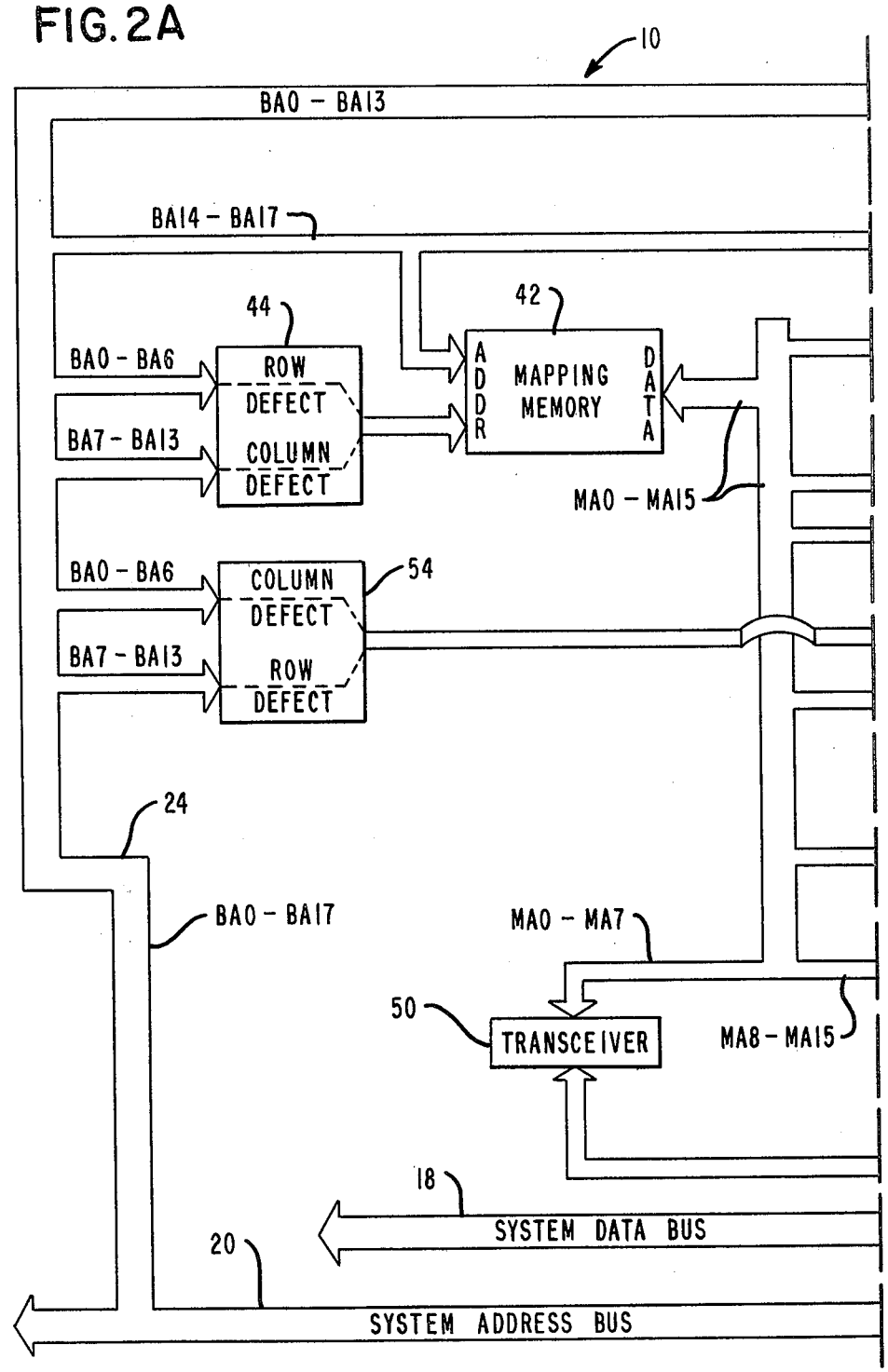
FIGS. 2A and 2B are a detailed block diagram of the memory system of FIG. 1.

Referring now to FIG. 1, there is shown in simplified form a memory system 10 in accordance with the present invention. The memory system 10 includes a primary memory 12 which, as will be described in greater detail later, consists of an array of memory devices in the form of integrated memory circuits. The memory system 10 further includes a backup or alternate memory 14 and memory control circuitry 16 for controlling the operation of the primary memory 12 and the alternate memory 14. The memory system 10 forms part of a larger data processing system and is connected to other subsystems, such as an associated central processing unit (CPU), by a system data bus 18 and a system address bus 20. The CPU is not shown but may be conventional, such as the 8085 microprocessor available from Intel Corporation, Santa Clara, Calif. The primary memory 12 and alternate memory 14 are connected to the system data bus 18 by a bidirectional internal data bus 22 and to the system address bus 20 by an internal address bus 24.

The memory devices in the primary memory 12 include a limited number of randomly located defective storage or memory cells. The purpose of the alternate memory 14 is to store replacement data for the data that is stored at memory locations in the primary memory 12 that have such defective storage cells, and to provide the replacement data when such memory locations in the primary memory are read.

In the presently preferred embodiment, the primary memory 12 is byte addressable so that, in response to an address provided by the system address bus 20, a byte of data is either taken from the system data bus 18 and written into a memory location in the primary memory 12, or a byte of data is read from a memory location in the primary memory 12 and provided to system data bus 18. In the event that the memory location that is addressed in the primary memory 12 has one or more bits that are stored at defective storage cells, the memory control 16 accesses the alternate memory 14 in order to store or provide such data bits.

As will be described later, the memory control 16 includes a mapping memory that is loaded during the initialization of the memory system 10. The mapping memory contains, for each data byte that is stored or to be stored at a memory location in the primary memory having defective cells, a control word that designates, in conjunction with the address of that byte in the primary memory, the address in the alternate memory of the replacement data that is to be written into or read from the alternate memory 14.

The alternate memory 14 is seen in FIG. 1 as including a byte memory 26 and a bit memory 28. The byte memory 26 is byte addressable and stores a byte of data at each of its memory locations. Each byte of data in the byte memory 26 is associated with a byte of data in the primary memory 12 that has multiple bit errors, i.e., has more than one bit stored at a defective cell. The bit memory 28, on the other hand, is bit addressable and stores only a single bit of data at each of its memory locations. Each bit of data in the bit memory 28 is associated with a byte of data in the primary memory 12 that has a single bit error, i.e., has only one bit stored at a defective cell. The alternate memory 14 further includes a bit substitution circuit 30 connected for receiving a bit from the bit memory 28. When a byte is read from the primary memory 12 having a single "bad bit" or bit error, the bit substitution circuit substitutes the data bit from the bit memory 28 for the single bad bit.

In operation, the memory control 16 checks the address on the address bus 20 and, during each access of the memory system 10, if the addressed memory location is not one with one or more defective storage cells, the primary memory 12 is accessed to store or read data.

In the event that the memory location addressed by the address on bus 20 is one that does have one or more defective cells, the memory control 16 recognizes the address as one for a memory location having one or more defective cells. When the addressed memory location has two or more defective cells, the alternate memory control 16 addresses a memory location in the byte memory 26. If a read operation is taking place, then a byte of data is provided by the byte memory 26 to the data bus 18. If a store or write operation is taking place, then the byte of data on data bus 18 is stored in the byte memory 26.

When the addressed memory location in the primary memory 12 has only a single defective cell, the memory control 16 addresses a memory location in the bit memory 28. If a store operation is taking place, the bit in the byte of data on data bus 18 that would be stored at the defective cell is passed (under the control of circuitry to be described later) from internal bus 22 to bit memory 28 to be written at the memory location addressed by memory control 16. The byte of data on data bus 18 is at the same time written into primary memory 12. If a read operation is taking place, the bit from the addressed memory location in bit memory 28 is provided to bit substitution circuit 30 along with the byte, including the bad bit, from primary memory 12. Bit substitution circuit 30 replaces the bad bit with the bit from bit memory 28 and provides the entire byte, including the substituted bit, to the data bus 18.

The provision of both the byte memory 26 and the bit memory 28 considerably reduces the amount of memory space that is needed in the alternate memory 14. In contrast to prior memory systems that may have used alternate memories, the alternate memory 14 of the present invention needs to store only a single bit for any byte read from the primary memory 12 that has only a single bit error. It has been found that the vast majority of bytes stored in a memory device that have bit errors will each have only a single bit error and, of course, only a single bit is needed for replacing the single bad bit. In those less frequent cases where a byte of data is stored at a memory location in primary memory 12 having multiple cell defects, the byte memory 26 can be used to provide an entire byte of data to replace the byte having multiple bit errors.

Figure 2B:
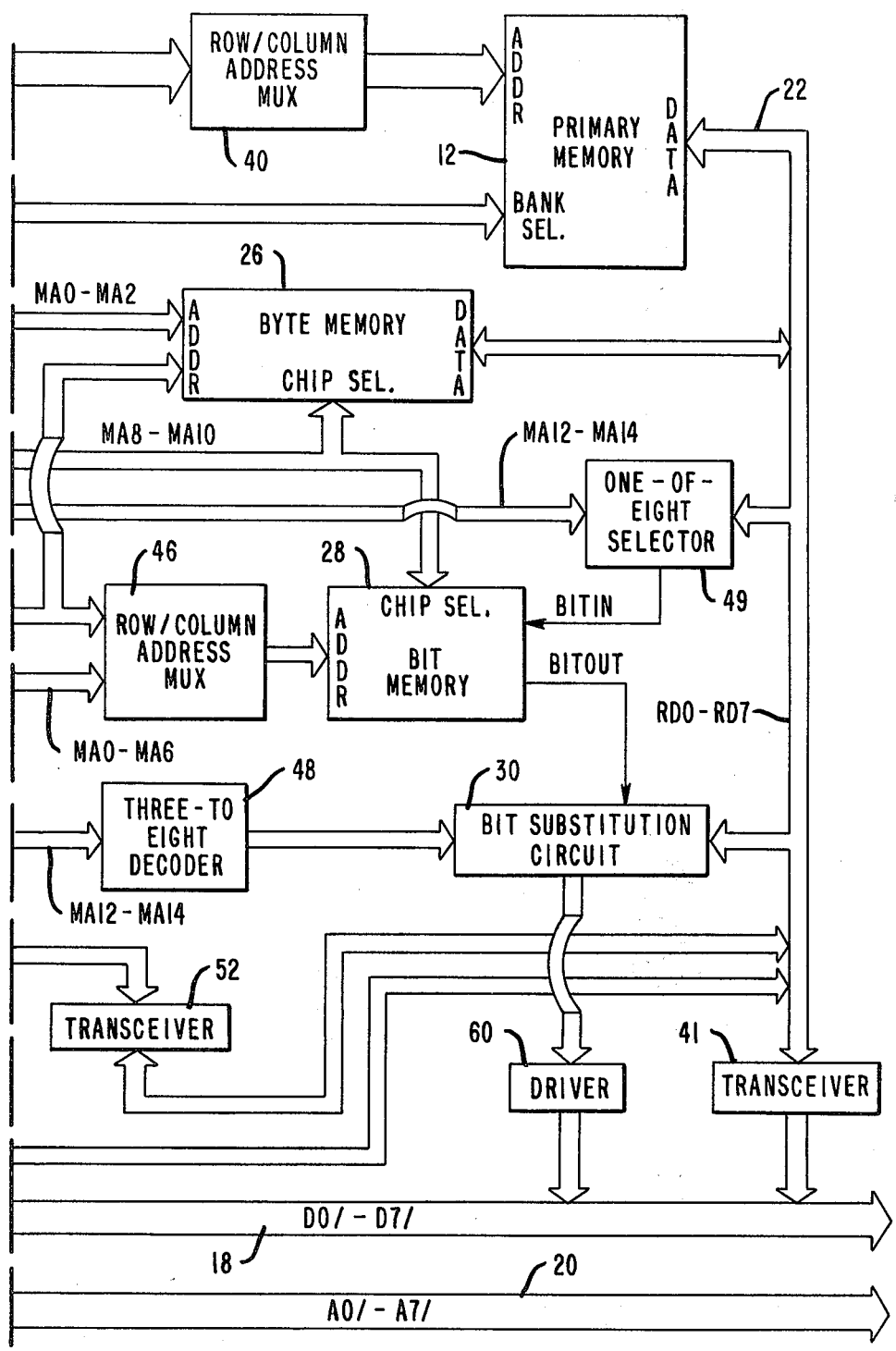

Referring now to FIGS. 2A and 2B, there is shown in greater detail the components of the memory system 10. The address inputs of the primary memory 12 are seen in FIGS. 2A and 2B as connected to the internal address bus 24 by way of a row/column address multiplexer (MUX) 40. The data input/output terminals of the primary memory 12 are connected to the bidirectional internal data bus 22, and the internal data bus 22 is, in turn, connected to the system data bus 18 by a transceiver 41.

In the presently preferred embodiment, the primary memory 12 consists of an array of 16K RAMs (random access memories) that collectively store 256K bytes of data. Each byte in the primary memory 12 is addressed by an eighteen-bit address (BA0-BA17) on internal address bus 24 received from system address bus 20. Fourteen bits (BA0-BA13) of the eighteen-bit address are passed through the MUX 40 and four bits (BA14-BA17) of the eighteen-bit address are provided directly to a bank select input of the primary memory 12. The MUX 40 passes the fourteen bits at its inputs, seven bits at a time, to the primary memory, with seven bits (BA0-BA6) representing a row address of a memory location in the primary memory and seven bits (BA7-BA13) representing a column address of a memory location in the primary memory.

Also seen in FIGS. 2A and 2B are the byte memory 26, the bit memory 28, and a mapping memory 42 that is used to control the transfer of data into and out of the byte memory 26 and the bit memory 28. The mapping memory 42 has address inputs that receive the bits BA14-BA17 directly from the internal address bus 24 and that receive either the bits BA0-BA6 or the bits BA7-BA13 from the internal address bus 24 by way of a wiring block 44. A control word consisting of sixteen control bits (MA0-MA15) is provided at the data input/output terminals of the mapping memory 42 when the memory system 10 is accessed for reading or writing. Bits MA0-MA2 are provided to address inputs of the byte memory 26, bits MA0-MA6 are provided, by way of a row/column address multiplexer (MUX) 46, to address inputs of the bit memory 28, bits MA8-MA10 are passed to a chip select input of both the byte memory 26 and bit memory 28, and bits MA12-MA14 are passed to both a three-to-eight decoder 48 and a one-of-eight selector 49. Only fourteen of the control bits (MA0-MA6 and MA7-MA14) are needed to control the byte memory 26 and bit memory 28, with the bits MA7 and MA15 used only during initialization so that a complete byte of control information may be transferred between the mapping memory and the system data bus 18 (since the system and internal data buses are byte wide in the preferred embodiment). Bytes of control information (MA0-MA7 and MA8-MA15) are passed between the mapping memory and the internal data bus 22 by transceivers 50 and 52.

In addition to receiving control bits from the mapping memory 42, the byte memory 26 and the MUX 46 at the address inputs of bit memory 28 receive either the bits BA0-BA6 or the bits BA7-BA13 that are passed from the internal address bus 24 by way of a wiring block 54.

The wiring blocks 44 and 54 are hardwired when the memory system 10 is constructed so that only one of the two sets of six bits provided at the inputs of each wiring block are passed. As will be more fully described later, the memory devices in the primary memory 12 are so chosen that they all have either all row defects or all column defects. If the memory devices have all row defects, then the wiring block 44 is hardwired so that the bits BA0-BA6 are passed to the mapping memory 42, and the wiring block 54 is hardwired so that the bits BA7-BA13 are passed to the address inputs of the byte memory 26 and to MUX 46 at the address inputs of bit memory 28. On the other hand, if the memory devices in the primary memory 12 have all column defects, then wiring block 44 will pass bits BA7-BA13 and wiring block 54 will pass bits BA0-BA6.

The one-of-eight selector 49 (FIG. 2B) is connected between the bit memory 28 and the internal data bus 22. When a byte is to be stored in the primary memory 12 at a location that has a single defective cell, the one-of-eight selector 49 receives the byte of data (bits RD0-RD7) from the internal data bus 22 and is controlled by bits MA12-MA14 from the mapping memory 42 to pass only the bit (BITIN) that would have been stored at the defective cell to the bit memory 28.

When a byte of data is read from the primary memory 12 at a location having a single cell defect, a bit (BITOUT) is read from the bit memory 28 and is passed to bit substitution circuit 30. The bit substitution circuit 30 also receives a byte (having the single bit error) from the primary memory 12 and is controlled by the three-to-eight decoder 48 to substitute the bit BITOUT for the bit in error. The byte of data at the output of the bit substitution circuit 30, which includes the substitute bit BITOUT, is passed by way of a driver 60 to the system data bus 18.

To understand the arrangement of data in the primary memory 12 and the use of byte memory 26, bit memory 28, and mapping memory 42 in order to replace the data stored at defective memory cells in the primary memory 12, reference can now be made to FIG. 3, where there is shown the arrangement of memory devices in the primary memory 12. As can be seen, the primary memory 12 consists of a sixteen-by-eight array of memory devices 12A which are individually identified in FIG. 3 by their coordinates in the array. For example, the memory device at Band 0, Column 0 in the array is identified as PM(0,0), and the memory device at Bank 15, Column 7 in the array is identified as PM(15,7). Each of the illustrated memory devices 12A is a 16K RAM, such as part no. 4116, available from Mostek Corporation, Carrollton, Tex., and has one hundred and twenty-eight rows and one hundred and twenty-eight columns of cells, each cell for storing a bit. Each memory device is bit-addressable and stores or provides one bit in response to a fourteen-bit address.

The fourteen bits BA0–BA13 passed through the MUX 40 (FIG. 2B) to the primary memory 12 will select one bit in each of the memory devices 12A. In addition, the four address bits BA14–BA17 provided to the bank select input of the primary memory as illustrated previously in FIG. 2B are passed through a conventional decoder (not shown) in the primary memory 12 to select one of the banks (Bank 0–Bank 15) of memory devices. The resulting eight bits, each bit associated with one of the memory devices in the selected bank, represent one byte of data that is being stored into or read from the primary memory 12. The term "memory location", as used herein to describe the memory space to store a byte of data in the primary memory 12, is the group of the eight corresponding cells, one cell in each of the eight memory devices of one bank, that store the bits of each byte.

An important feature of the memory system 10 is the reduced size of the mapping memory 42 (FIG. 2A) obtained by choosing the memory chips 12A (FIG. 3) in the primary memory 12 so that all of the chips have either all row defects or all column defects. As is well known to those skilled in the art, by "all row defects" it is meant that when one or more cell defects occur in a row of cells, every cell in that row is considered defective. Similarly, by "all column defects" it is meant that when one or more cell defects occur in a column of cells, every cell in that column is considered defective. Since the cells in the same defective row have the same row address and the cells in the same defective column have the same column address, the provision of the address bits BA0–BA6 or address bits BA7–BA13 from the wiring block 54 (FIG. 2A) to the addressing inputs of the byte memory 26 and the bit memory 28 eliminate the need for storing those address bits in the mapping memory 42. Accordingly, the bits provided by the mapping memory are only a portion of the address bits needed by the byte memory and bit memory, with the remaining bits needed to address the byte memory or bit memory coming from the wiring block 54.

In order to reduce the size of the alternate memory 14, the memory chips in the primary memory are chosen to also have a limited number of rows or columns with defects. In the presently preferred embodiment, no more than four rows or four columns will have defects in each of the memory chips 12A. Such a constraint does not significantly affect the cost of the memory circuits 12A, since it has been found that a high percentage of manufactured integrated memory circuits of the type used in primary memory 12 that have cell defects will have four or less rows or columns with defects. The relatively high yield of such circuits having four or less rows or columns with defects results, of course, in their being much less expensive than defect-free circuits.

FIG. 3 illustrates the memory devices 12A having only row defects. As indicated by the shaded portions in the drawing, Bank 0 has defects in Row 0 of the memory device 12A at PM (0,0), Row 82 of the memory device 12A at PM (0,0), Row 0 of the memory device 12A at PM (0,1) and Row 57 of the memory device 12A at PM (0,1). The other memory devices 12A have row defects that are not illustrated. When all the storage cells in one of the rows are considered defective, there will be a resulting 128 bits in that memory device that must be replaced with data bits in the alternate memory 14. In addition, if there are defects in the same row in two or more memory devices of the same bank, such as is illustrated by the defects in Row 0 of the memory devices at both PM (0,0) and PM (0,1), then the corresponding 128 data bytes that are stored in that bank and that include bits from these two rows have multiple bit errors and must each be replaced with an entire byte of data from the byte memory 26 of the alternate memory 14. Of course, if the same row in any other memory device of the same bank does not also have cell defects, then the corresponding 128 data bytes that include the bits from the single defective row have only single bit errors, and must each have the single bad bit replaced by a bit from the bit memory 28 of the alternate memory 14.

FIG. 4 illustrates the format and use of the control bits MA0–MA15 that are stored in the mapping memory 42 for each byte that is stored in or read from the primary memory 12 at a memory location having one or more defective cells. In particular, there is shown the format of the bits MA0–MA15 for the case where there is "NO ERROR" in the bits of the accessed data byte, where there is a "SINGLE BIT ERROR" in the accessed data byte, and where there are "MULTIPLE BIT ERRORS" in the accessed data byte. The format illustrated in FIG. 4 is the same, regardless of whether the memory devices in the primary memory 12 have "all row" or have "all column" defects.

As can be seen in FIG. 4, bits MA0–MA2 provide the mapped portion of the address bits to the byte memory 26 in the event that the byte of data accessed at the primary memory 12 contains multiple bit errors. In the event that the byte of data accessed at the primary memory 12 contains only a single bit error, then bits MA0–MA6 of the output of the mapping memory 42 provide a mapped column address for the bit memory 28. As indicated earlier, the bits MA0–MA6 are provided, along with the bits at the output of the wiring block 54, to the row/column address MUX 46. The MUX 46 passes the bits at the output of the wiring block 54 (bits BA0–BA6 in the event of all column defects and bits BA7–BA13 in the event of all row defects) to the bit memory 28 in order to address a row in the bit memory. The MUX 46 then passes the bits MA0–MA6 to address a column in the bit memory, so that a single bit is accessed in the bit memory.

The bits MA8–MA10 provide chip select signals to the byte memory 26 and the bit memory 28. As will be described later in conjunction with FIGS. 6, 7A and 7B, both the byte memory 26 and the bit memory 28 consist of a plurality of memory devices or chips, with the bits MA8–MA10 selecting one of the devices in each memory. The bit MA11 indicates, if at a "0", that the addressed byte at the primary memory must have only a single bit replaced because of a single bit error, and indicates, if at a "1" (unless there are no errors), that the entire byte must be replaced because of multiple bit errors. The bits MA12–MA14 select, in the event of a single bit error, the bit in the addressed byte that must be replaced. As mentioned earlier in conjunction with FIGS. 2A and 2B, bits MA12–MA14 are provided to the three-to-eight decoder 48, which in turn provides control signals to the bit substitution circuit 30. The bits MA12–MA14 are also provided to the one-of-eight selector 49. When the primary memory 12 is storing a byte of data from the data bus 18 that contains a single bit that is to be stored at a cell having a defect, the byte is presented also to the one-of-eight selector 49. The one-of-eight selector determines, in accordance with bits MA12–MA14, which one of the bits could be stored at the defective cell location, and stores that bit (BITIN) in the bit memory 28.

It should be noted that the specific circuitry for implementing the memory system 10, which will be described shortly in conjunction with FIGS. 5A through 10, uses bits MA8–MA11 to indicate that the byte accessed from the primary memory 12 has no bit errors. In particular, when all of the bits MA8–MA11 are at a "1", no bit or byte substitution will take place. It should further be noted that, since only fourteen bits are needed at the output of mapping memory 42 for the purposes described above, two bits (MA7 and MA15) are illustrated in FIG. 4 as not used in any of the three conditions "NO ERROR", "SINGLE BIT ERROR", and "MULTIPLE BIT ERRORS".

FIGS. 5A–10 are schematic circuit diagrams illustrating a specific embodiment of the memory system 10 and FIGS. 11A–11D are timing diagrams illustrating various signals used in the circuitry of FIGS. 5A–10.

Figure 5A:
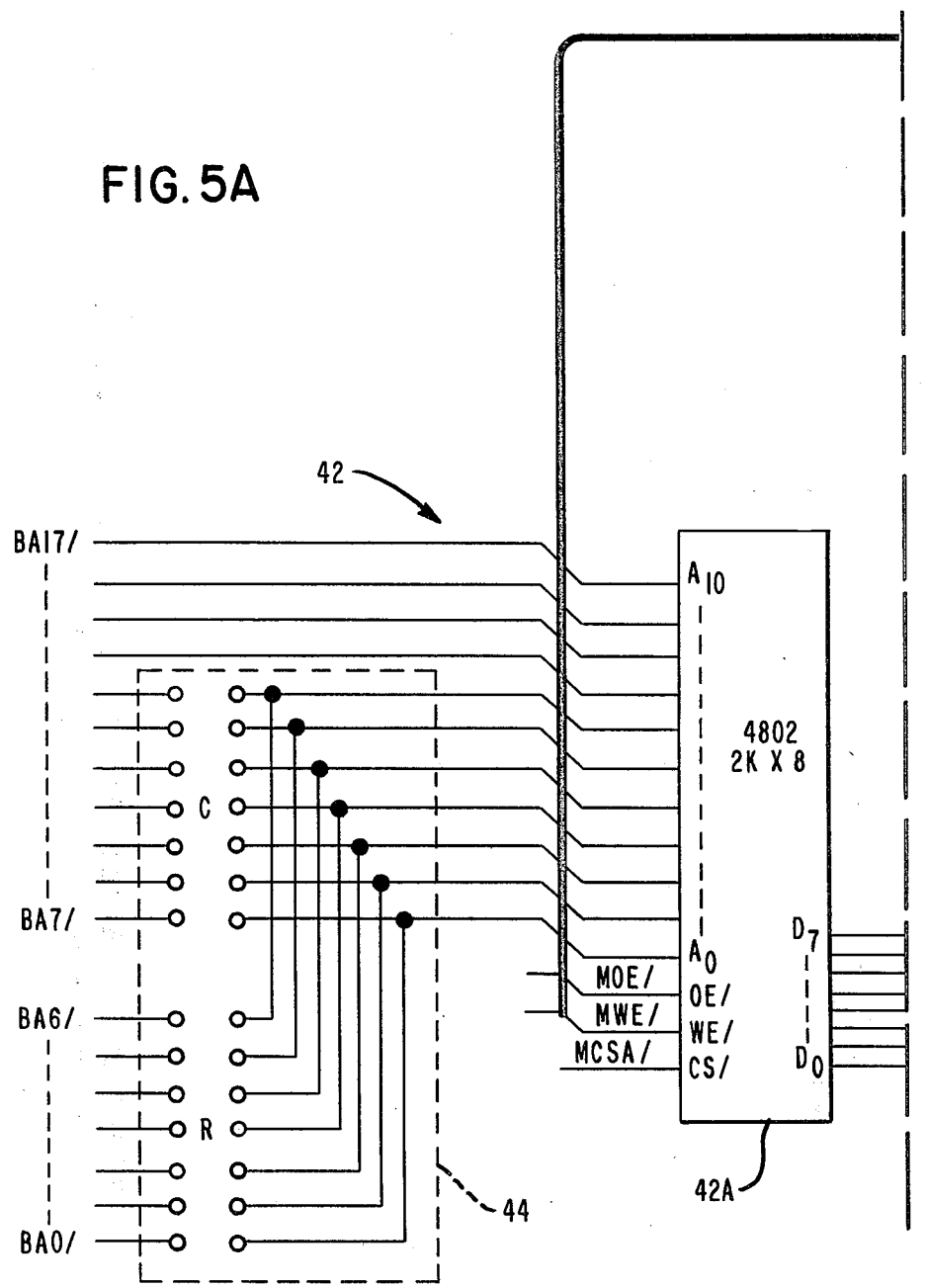
FIGS. 5A and 5B are a detailed circuit diagram of the mapping memory seen in FIG. 2A.
Figure 5B:
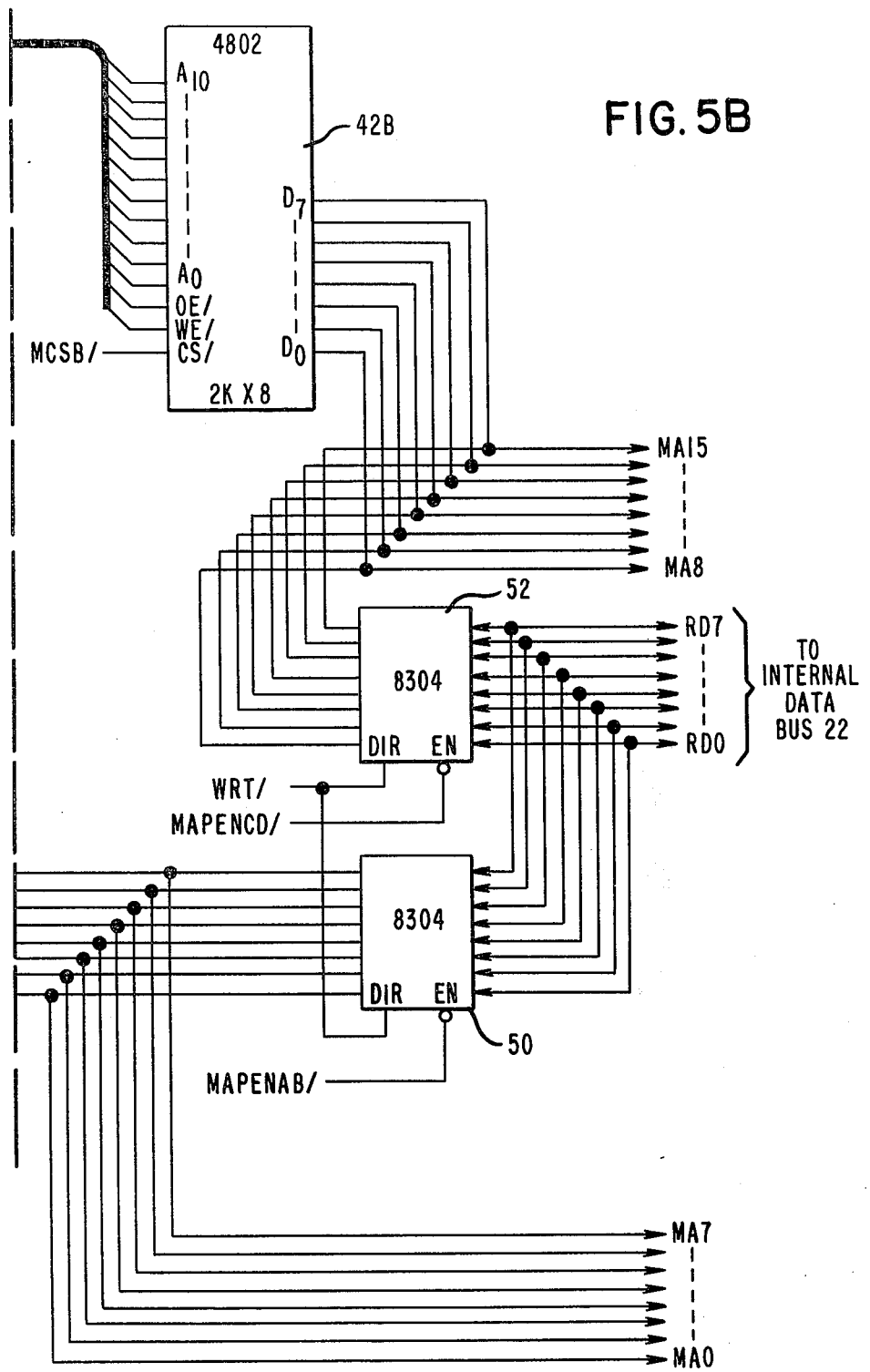

Referring to FIGS. 5A and 5B, there is shown the circuit components of the mapping memory 42 and associated circuitry. As can be seen, the mapping memory 42 includes memory devices or chips 42A and 42B that are each a byte-addressable 2K × 8 RAM, such as part no. 4802, available from Mostek Corporation. The memory devices 42A and 42B are accessed simultaneously to store or provide the control bits MA0–MA15. In particular, the memory device 42A stores the control bits MA0–MA7 and the memory device 42B stores the control bits MA8–MA15. As mentioned earlier, two bits (MA7 and MA15) are not used, except during initialization.

Each of the memory devices 42A and 42B receives the bits BA14/–BA17/ directly from the internal address bus 24 and either the bits BA0/–BA6/ or the bits BA7/–BA13/ from the bus 24 by way of the wiring block 44. As illustrated in FIG. 5A, if the devices in the primary memory 12 have all row defects, then electrical connections are made within block 44 at the location designated "R", and if the devices in the primary memory have all column defects, the electrical connections are made within the block 44 at the location designated "C".

The memory devices 42A and 42B also both receive a map output enable signal MOE/ and a map write enable signal MWE/. In addition, the memory device 42A receives a chip select signal MCSA/ and the memory device 42B receives a chip select signal MCSB/. The memory devices 42A and 42B are normally not individually selected, except during initialization to store and check the contents of the memory devices.

The bidirectional data input/output terminals of the devices 42A and 42B provide the control bits MA0–MA15 and are also connected, by way of the transceivers 50 and 52, to the internal data bus 22. The transceivers 50 and 52, as mentioned previously in connection with FIGS. 2A and 2B, are used during initialization of the mapping memory in order to store and read control bits from the memory devices 42A and 42B. The direction of the bits passing through each of the transceivers 50 and 52 is controlled by a signal WRT/ that is generated by the CPU and that determines whether the memory system is in a read cycle or a write cycle. Transceiver 50 is enabled by a signal MAPENAB/ and transceiver 52 is enabled by a signal MAPENCD/.

Figure 6:
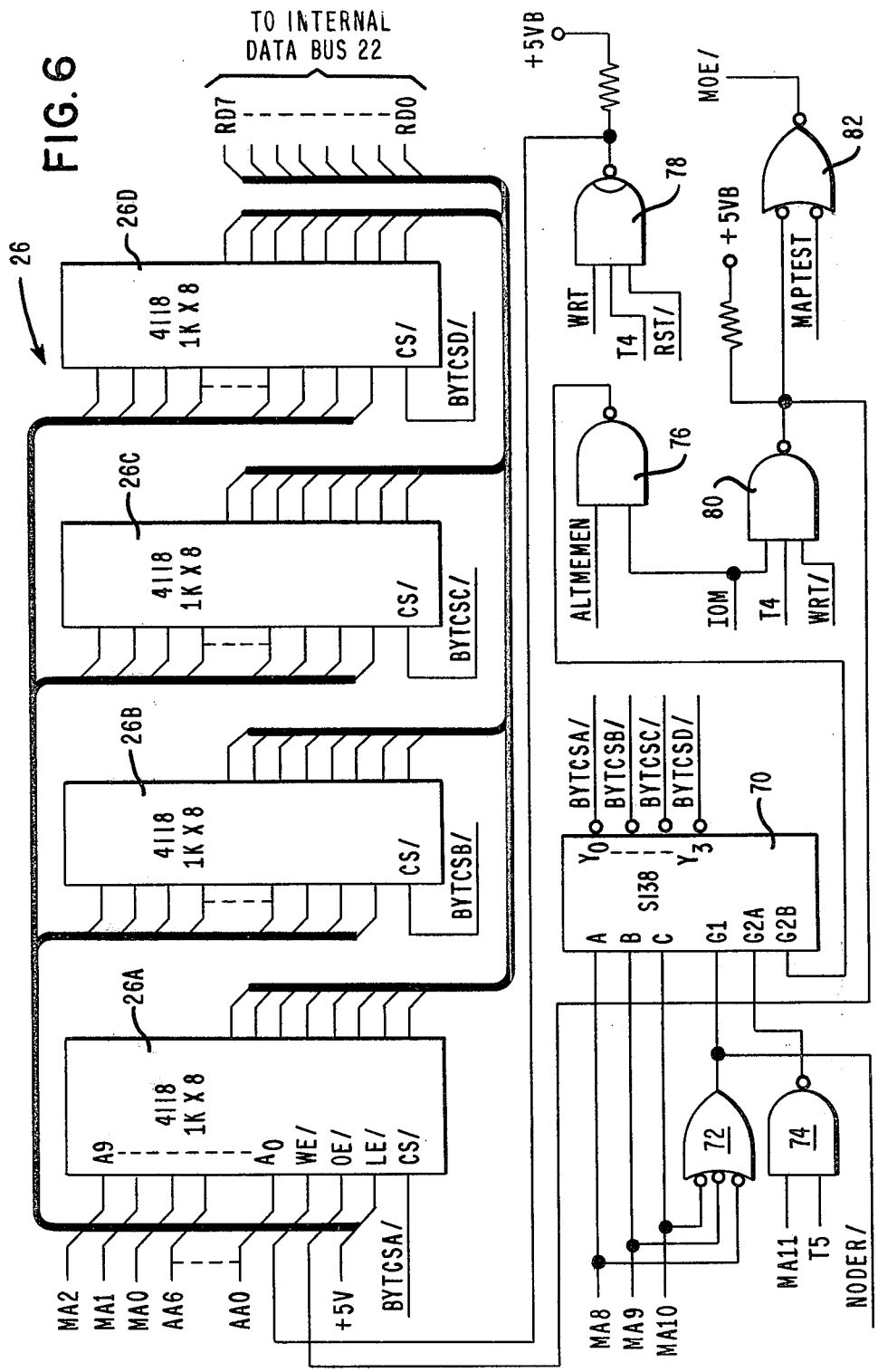
FIG. 6 is a detailed circuit diagram of the byte memory seen in FIG. 2B.

FIG. 6 is a detailed circuit diagram of the byte memory 26 and associated circuitry. As can be seen, the byte memory 26 includes byte-addressable memory devices 26A, 26B, 26C and 26D. The memory devices 26A–26D are each a 1K × 8 RAM, such as part no. 4118, available from Mostek Corporation. Any one of the memory devices 26A–26D may be selected to store or read the eight bits of the data byte that is to replace the data byte being stored or read at the primary memory 12. The eight bits appear as the bits RD0–RD7 in FIG. 6 and are passed to or from the internal data bus 22 (FIG. 2B). The memory devices 26A–26D are addressed by the control bits MA0–MA2 and the bits (AA0–AA6) from the output of the wiring block 54 (FIG. 2A).

Circuitry shown in FIG. 6 that is associated with the byte memory 26 includes a decoder 70, an OR gate 72 and a NAND gate 74. The data inputs (A, B and C) of the decoder 70 and the inputs of the OR gate 72 receive the control bits MA8, MA9 and MA10. The NAND gate 74 receives the control bit MA11 and a timing signal T5. The control inputs of the decoder 70 receive the output of the OR gate 72, the output of the NAND gate 74 and the output of a NAND gate 76. The inputs of the NAND gate 76 receive an alternate memory enabling signal ALTMEMEN and an input-output-memory signal IOM from the previously mentioned CPU, with the signal IOM enabled when the use of the memory system 10 is requested. The outputs of the decoder 70 provide chip select signals BYTCSA/, BYTCSB/, BYTCSC/ and BYTCSD/ for the memory devices 26A, 26B, 26C and 26D, respectively.

An open collector NAND gate 78 in FIG. 6 receives the non-inverted signal WRT, a timing signal T4 and a reset signal RST/, and provides a signal to the write enable inputs of each of the memory devices 26A–26D. The WRT signal, as mentioned earlier, determines whether the memory system is either in a read cycle or a write cycle. The RST/ signal is enabled if there is a power failure and a resulting absence of power signals to the memory system. The output of the NAND gate 78 is also connected to a five volt battery by a resistor, to keep the memory devices 26A–26D in a read mode in the event of a power failure.

The signal IOM is also provided to a NAND gate 80 in FIG. 6 along with the timing signal T4 and the signal WRT/. The output of the NAND gate 80 is provided to the output enable input of each of the byte memory devices 26A–26D and to a NOR gate 82 along with a signal MAPTEST. The signal MAPTEST is enabled during initialization of the mapping memory so that the contents of the mapping memory can be read back to the CPU for checking. The mapping memory output enable signal MOE/ is provided at the output of the NOR gate 82 to enable the mapping memory devices 42A and 42B (FIG. 5).

Figure 7A:
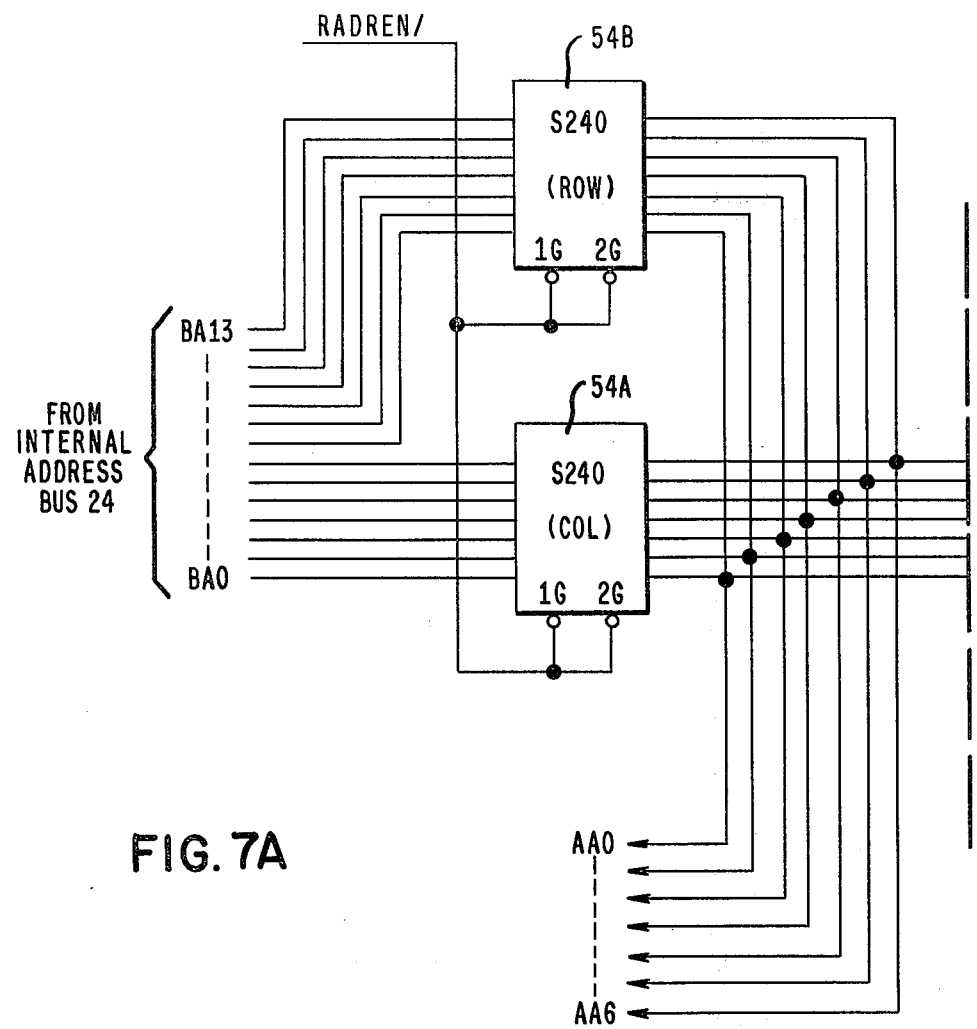
FIGS. 7A and 7B are a detailed a circuit diagram of the bit memory seen in FIG. 2B.
Figure 7B:
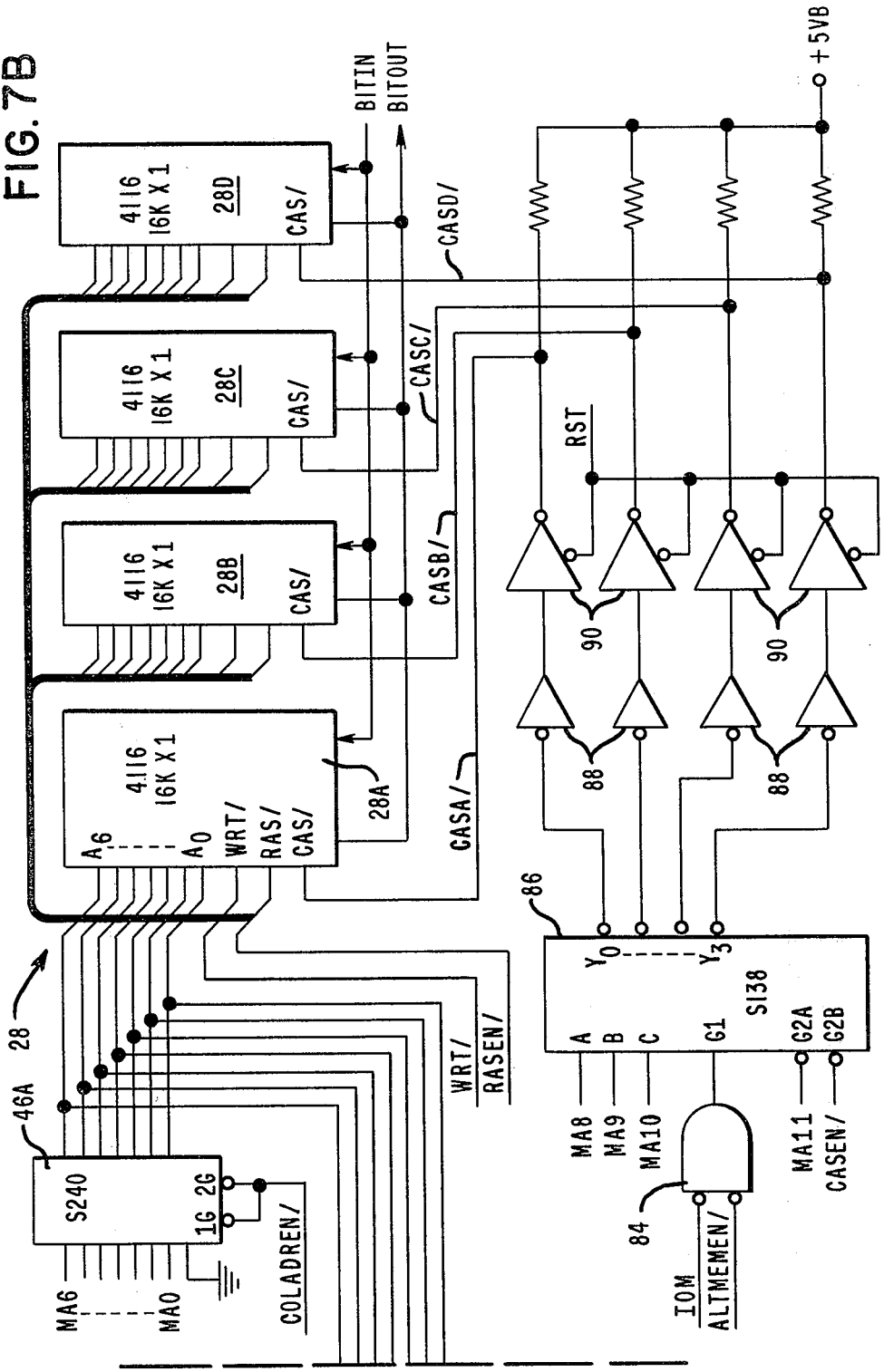

The bit memory 28 and associated circuitry is shown in detail in FIGS. 7A and 7B, and includes bit-addressable memory devices 28A, 28B, 28C and 28D. Each of the memory devices 28A–28D receives the mapped column address bits MA0–MA6 by way of a tri-state driver circuit 46A and receives bits AA0–AA6 from either a tri-state driver circuit 54A or a tri-state driver circuit 54B. The tri-state driver circuits 54A and 54B perform the function of the wiring block 54 mentioned earlier in conjunction with FIG. 2A. Only one of the driver circuits 54A and 54B is used in actual practice, with the one being used determined by whether the primary memories devices 12A have all row defects or have all column defects. If the memory devices in the primary memory 12 have only column defects, then only tri-state driver circuit 54A is enabled or used and it passes (as bits AA0–AA6) the bits BA0–BA6 from the internal address bus 24. On the other hand, if the memory devices in primary memory 12 have only row defects, then only tri-state driver circuit 54B is enabled or used, and it passes (as bits AA0–AA6) the bits BA7–BA13 from the internal address bus 24.

The tri-state driver circuit 46A and the enabled one of the tri-state driver circuits 54A and 54B are also used to perform together the function of the row/column address MUX 46 mentioned earlier in conjunction with FIG. 2B. Each of the driver circuits 54A and 54B receives a row address enabling signal RADREN/ to selectively pass the bits from the address bus in order to address rows in the memory devices 28A–28D. The tri-state driver circuit 46A is enabled by a column addressing enable signal COLADREN/, which causes the bits MA0–MA6 to address one of the columns in the memory devices 28A–28D.

The address inputs at each of the memory devices 28A–28D receive the seven bits at the output of the tri-state driver circuit 46A and the seven bits at the enabled one of the tri-state driver circuits 54A and 54B. Each of the memory devices 28A–28D further receives the signal WRT/ that indicates whether a read operation or a write operation is to take place and a row address strobe enable signal RASEN/ that indicates when the bits at the address inputs are row address bits (the bits AA0–AA6 from either driver circuit 54A or driver circuit 54B). The memory devices 28A, 28B, 28C and 28D further receive column address strobe enable signals CASA/, CASB/, CASC/ and CASD/ that indicate when the bits at the address inputs are column address bits (the bits MA0–MA6 from driver circuit 46A). The column address strobe enable signals CASA/, CASB/, CASC/ and CASD/ are also used to provide a chip select signal for the memory devices 28A, 28B, 28C and 28D, respectively, and the selected one of the memory devices stores the single input bit BITIN provided from the one-of-eight selector 49 (FIG. 2B) or reads out the single output bit BITOUT.

The circuitry for providing the chip select signals (CASA/, CASB/, CASC/ and CASD/) to the memory devices 28A–28D is seen in FIG. 7B and includes an AND gate 84, a 3-to-8 line decoder 86, a set of inverters 88, and a set of inverting tri-state drivers 90. The AND gate 84 receives the signal IOM and the inverted alternate memory enabling signal ALTMEMEN/. The decoder 86 receives, at its control inputs, the output of the AND gate 84, the control bit MA11, and a column address strobe enable signal CASEN/. The decoder 86 receives at its data inputs (A, B and C) the control bits MA8, MA9 and MA10. The decoded signals at the outputs of the decoder 86 are provided to the set of inverters 88 and the set of drivers 90. The outputs of the drivers 90 provide the chip select signals CASA/, CASB/, CASC/ and CASD/ to the memory devices 28A–28D, respectively.

The drivers 90 in FIG. 7B each include a control input for receiving the signal RST, and the outputs of the drivers 90 are each connected to a five volt battery by way of a resistor, as illustrated. When there is a power failure, the drivers 90 are disabled by the signal RST. The chip select signals CASA/–CASD/ are all then held at a disabled high state by the connection of the outputs of the drivers 90 to the five volt battery.

Figure 8A:
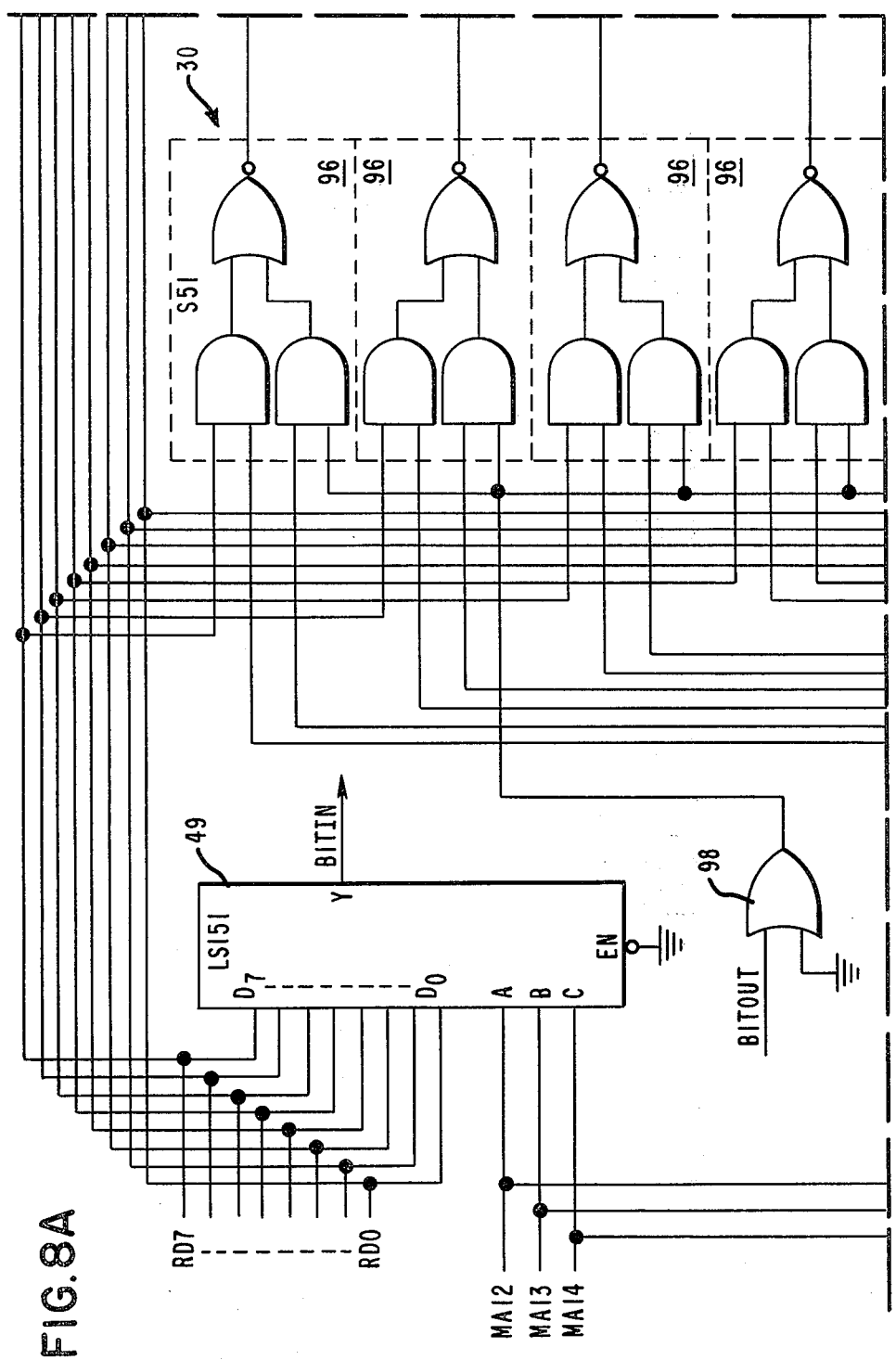
Figure 8C:
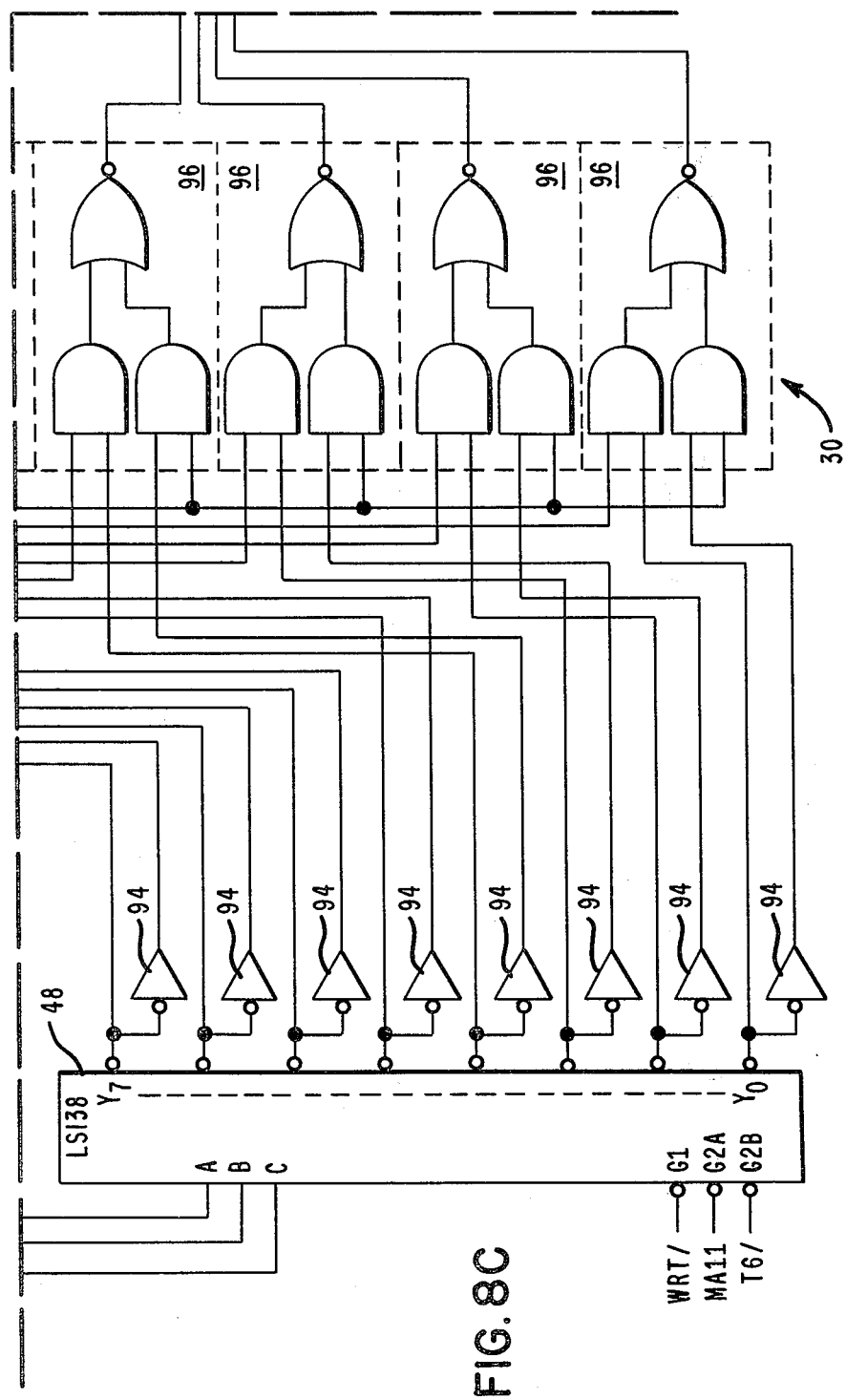

In FIGS. 8A–8D there are shown, in detail, the bit substitution circuit 30, the three-to-eight decoder 48, and the one-of-eight selector 49, all of which were mentioned previously in conjunction with FIGS. 2A and 2B. As can be seen in FIG. 8A, one-of-eight selector 49 receives the bits RD0–RD7 from the internal bus 22 and the three control bits MA12–MA14 from the mapping memory 42. The output of the one-of-eight selector 49 provides the bit BITIN to the bit memory 28.

The three-to-eight decoder 48 (FIG. 8C) receives at its data inputs the control bits MA12–MA14 from the mapping memory 42. The control inputs of the three-to-eight decoder 48 receive the signal WRT/, the control bit MA11, and a timing signal T6/. The output bits of the three-to-eight decoder 48 are provided both directly and by way of inverters 94 to the bit substitution circuit 30. The bit substitution circuit 30 (FIGS. 8A and 8C) consists of eight logic circuits, each designated 96. The inputs of each logic circuit 96 receive one of the data bits RD0–RD7 from the internal data bus 22, the bit BITOUT from the bit memory 28 by way of a buffering OR gate 98, one of the bits directly from the output of the three-to-eight decoder 48, and a bit from a corresponding one of the inverters 94.

The bit BITOUT is substituted for one of the bits from the internal data bus in accordance with the control bits MA12–MA14 that are provided to the three-to-eight decoder 48. The bits provided directly and by way of the inverters 94 from the outputs of the three-to-eight decoder 48 cause a selected one of the logic circuits 96 to replace one of the data bits RD0–RD7 with the bit BITOUT, and cause the remaining logic circuits 96 to pass, unchanged, the remaining ones of the bits RD0–RD7 from the internal data bus 22. The bits at the output of the bit substitution circuit 30 are passed by way of a fall-through latch circuit 100 (FIG. 8D) and a driver circuit 60A (FIG. 8D) to the system data bus 18.

Transceivers 41A and 41B, which perform the function of the transceiver 41 that was described earlier in connection with FIGS. 2A and 2B, are shown in FIG. 8B as connected between the internal data bus 22 and the system data bus 18.

Figure 8D:
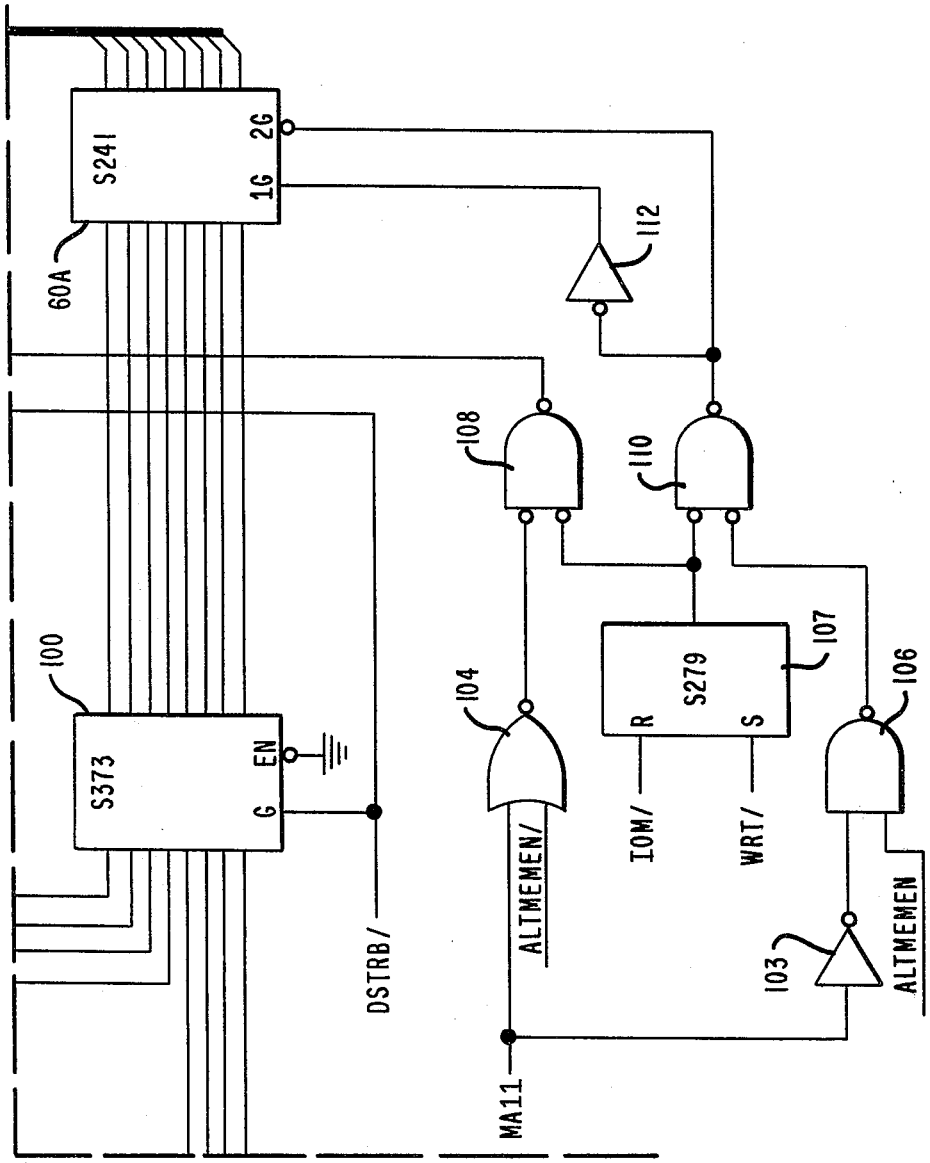
Figure 8:
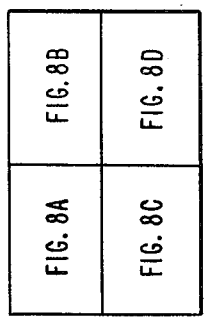
FIG. 8 illustrates the relationship of FIGS. 8A-8D.

As seen in FIG. 8D, the latch 100 is controlled by a strobing signal DSTRB/ and the driver circuit 60A and transceivers 41A and 41B are controlled by logic circuitry that includes an inverter 103, a NOR gate 104, a NAND gate 106, a latch 107, a NAND gate 108, a NAND gate 110, and an inverter 112. The inverter 103 and NOR gate 104 each receives the control bit MA11, and the NAND gate 106 receives the signal ALTMEMEN and the output of the inverter 103. The NOR gate 104 receives the inverted signal ALTMEMEN/ and the latch 107 receives the signals IOM/ and WRT/. The NAND gate 108 receives the output of NOR gate 104 and the output of the latch 107. The output of the NAND gate 108 is provided, along with the signal WRT/, the non-inverted signal WRT, and the signals IOM and DSTRB/, to the control inputs of the transceivers 41A and 41B.

The NAND gate 110 receives the output of the latch 107 and the output of the NAND gate 106 and provides its output both directly and by way of the inverter 112 to the control inputs of the driver circuit 60A.

As mentioned earlier in conjunction with FIGS. 2A and 2B, the mapping memory 42 undergoes an initialization, during which control bits MA0–MA15 are provided to the mapping memory for each byte of data that is stored in the primary memory 12 at a memory location having one or more defective cells. In Appendix A attached hereto, there is illustrated a program executed by the previously mentioned CPU in order to cause the mapping memory 42 to undergo initialization.

Figure 9A:
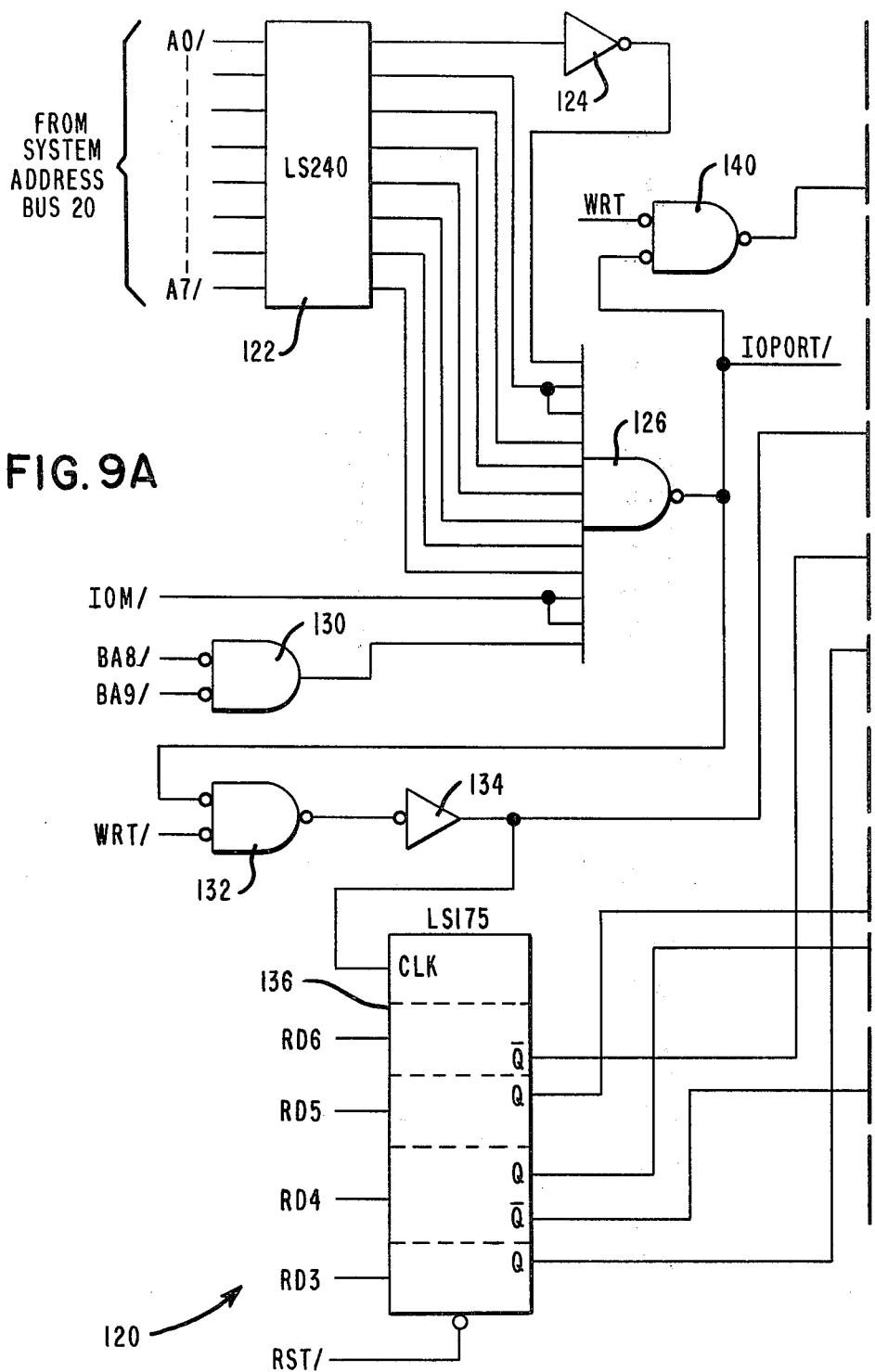
FIGS. 9A and 9B are a detailed circuit diagram of map initialization control circuitry for controlling the storing of control information in the mapping memory seen in FIG. 2A.
Figure 9B:
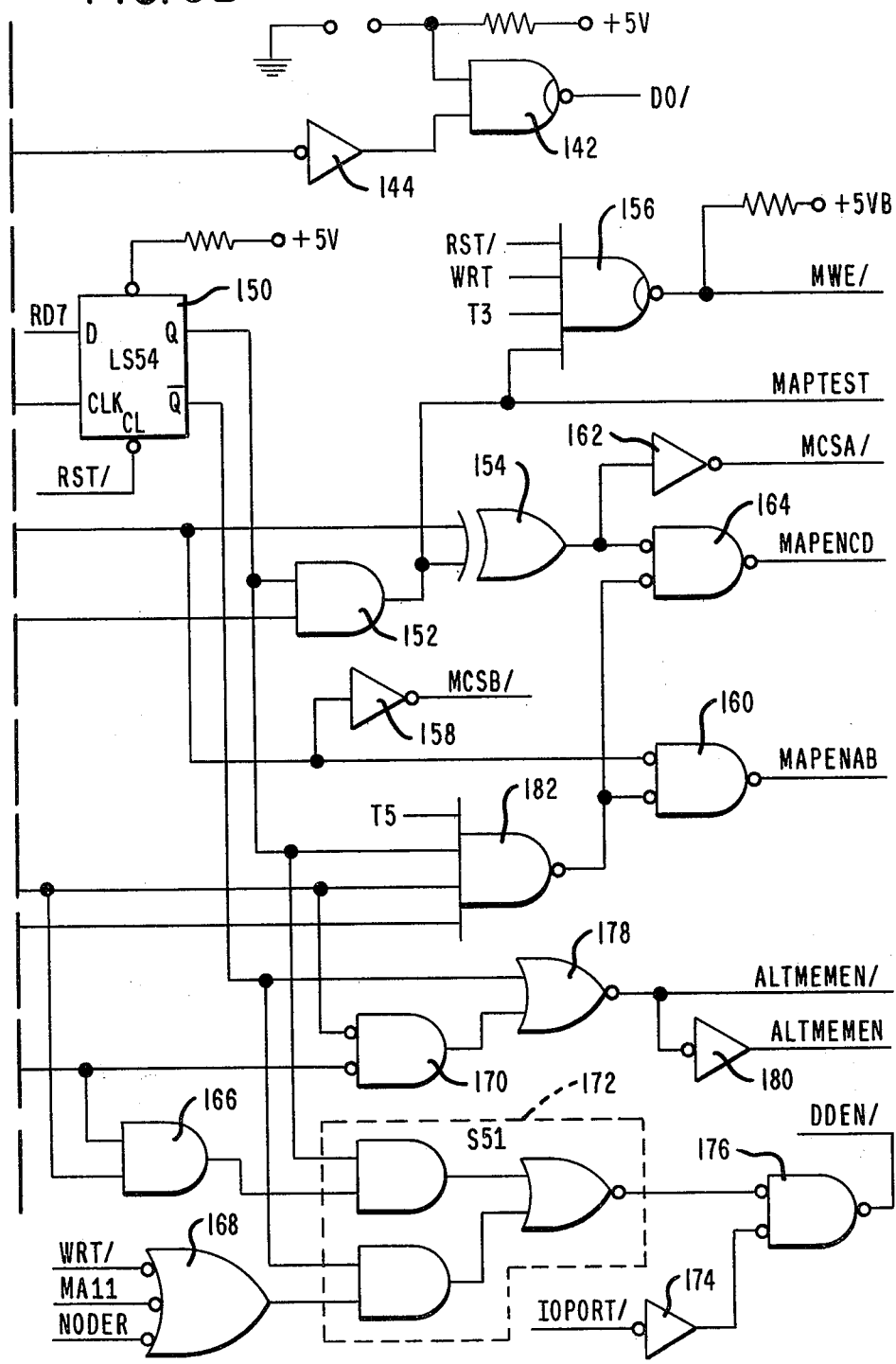

In addition, FIGS. 9A and 9B show initialization circuitry 120 that is connected to one port of the system data bus 18 and system address bus 20 and that is used to control the mapping memory 42 during initialization. When the specific port at which the initialization circuitry 120 is located is addressed, by bits A0–A7/ on the system address bus 20, the data bits RD3–RD6 on the internal data bus 22 form a command that controls the signals that are generated by the initialization circuit. The address bits A0–A7/ are passed, by way of a driver circuit 122 and a single inverter 124, to a NAND gate 126.

The NAND gate 126 also receives the signal IOM/ from the CPU and the signal at the output of a NAND gate 130. The NAND gate 130 receives the bits BA8/ and BA9/. When all of the inputs to the NAND gate 126 are at a "1", the signal IOPORT/ at the output of the NAND gate 126 goes low and indicates that the port has been addressed and that the data bits RD3–RD6 have command information for the initialization circuit 120. The signal IOPORT/ is passed, by way of NAND gate 132 and an inverter 134 to the clocking input of a flip-flop circuit 136. The NAND gate 132 also receives the signal WRT/ from the CPU. The flip-flop circuit 136 is cleared by the signal RST/.

The signal IOPORT/ at the output of NAND gate 126 is also provided to a NAND gate 140 along with the non-inverted WRT signal. The output of the NAND gate 140 is provided to one input of an open collector NAND gate 142 by way of an inverter 144. The other input of the NAND gate 142 is connected to a five volt voltage source by way of a resistor. The same input is also optionally connected or "strapped" to ground. If this input is strapped to ground, then the bit D0/ at the output of the NAND gate 142 indicates that the memory devices in the primary memory 12 have all column defects. If this input is not strapped to ground, then the signal D0/ at the output of NAND gate 142 indicates that the memory devices in the primary memory 12 have all row defects. The signal D0/ is provided, by way of the system data bus 18, to the CPU for its use when executing the program in Appendix A during initialization.

The bit RD7 on the internal data bus 22 is provided by the CPU in order to indicate whether initialization is required as a result of a start-up of operations or is required as a result of a power failure. The bit RD7 is provided to a flip-flop 150 (FIG. 9B). The flip-flop 150 is clocked by the output of inverter 134 and is cleared by the signal RST/. The non-inverted output of the flip-flop 150 is provided to an AND gate 152, which also receives the bit RD3 that has been latched into one stage of the flip-flop circuit 136. The AND gate 152 provides the signal MAPTEST (mentioned earlier in connection with FIG. 6) and its output is connected to an Exclusive OR gate 154 and an open collector NAND gate 156.

The Exclusive OR gate 154 also receives the bit RD6 that has been latched into the flip-flop circuit 136. The latched bit RD6 from flip-flop circuit 136 is also provided to an inverter 158 and a NAND gate 160. The output of the Exclusive OR gate 154 is provided to an inverter 162 and a NAND gate 164. The NAND gate 156 receives, in addition to the output of gate 152, the signals RST/, WRT, and a timing signal T3.

Also seen in FIG. 9B is a NAND gate 166 which receives the bits RD4 and RD5 that have been latched into the flip-flop circuit 136, an OR gate 168 which receives the signal WRT/, the control bit MA11 and the bit or signal NODER/ (from gate 72 in FIG. 6), and an AND gate 170 which also receives the bits RD4 and RD5 that have been latched into the flip-flop circuit 136. The outputs of the flip-flop 150, the AND gate 166, and the OR gate 168 are provided to a logic circuit 172. The output of the logic circuit 172 is provided, with the signal IOPORT/ by way of an inverter 174, to a NAND gate 176.

A NOR gate 178 receives the signals at the output of AND gate 170 and the inverted output of flip-flop 150. The output of NOR gate 178 is provided to an inverter 180. A NAND gate 182 receives the bits RD4 and RD5 latched into the flip-flop circuit 136, the non-inverted output of flip-flop 150, and the timing signal T5, and is connected to one input of each of the NAND gates 160 and 164.

The NAND gate 156 provides the mapping memory write enable signal MWE/ and its output is connected to a five volt battery by a resistor. The inverters 158 and 162 provide, respectively, the mapping memory chip select signals MCSB/ and MCSA/. The NAND gates 160 and 164 provide, respectively, the signals MAPENAB/ and MAPENCD/. The signal ALTMEMEN/ is provided at the output of NOR gate 178 and the signal ALTMEMEN is provided at the output of the inverter 180.

A signal DDEN/ is provided at the output of the NAND gate 176 and is used to enable the drivers in the primary memory 12. If the data stored at a particular byte in the primary memory 12 has no errors or a single bit error, then the signal DDEN/ enables the drivers in the primary memory. If the data byte has multiple bit errors, then the primary memory is disabled by the signal DDEN/.

Figure 10:
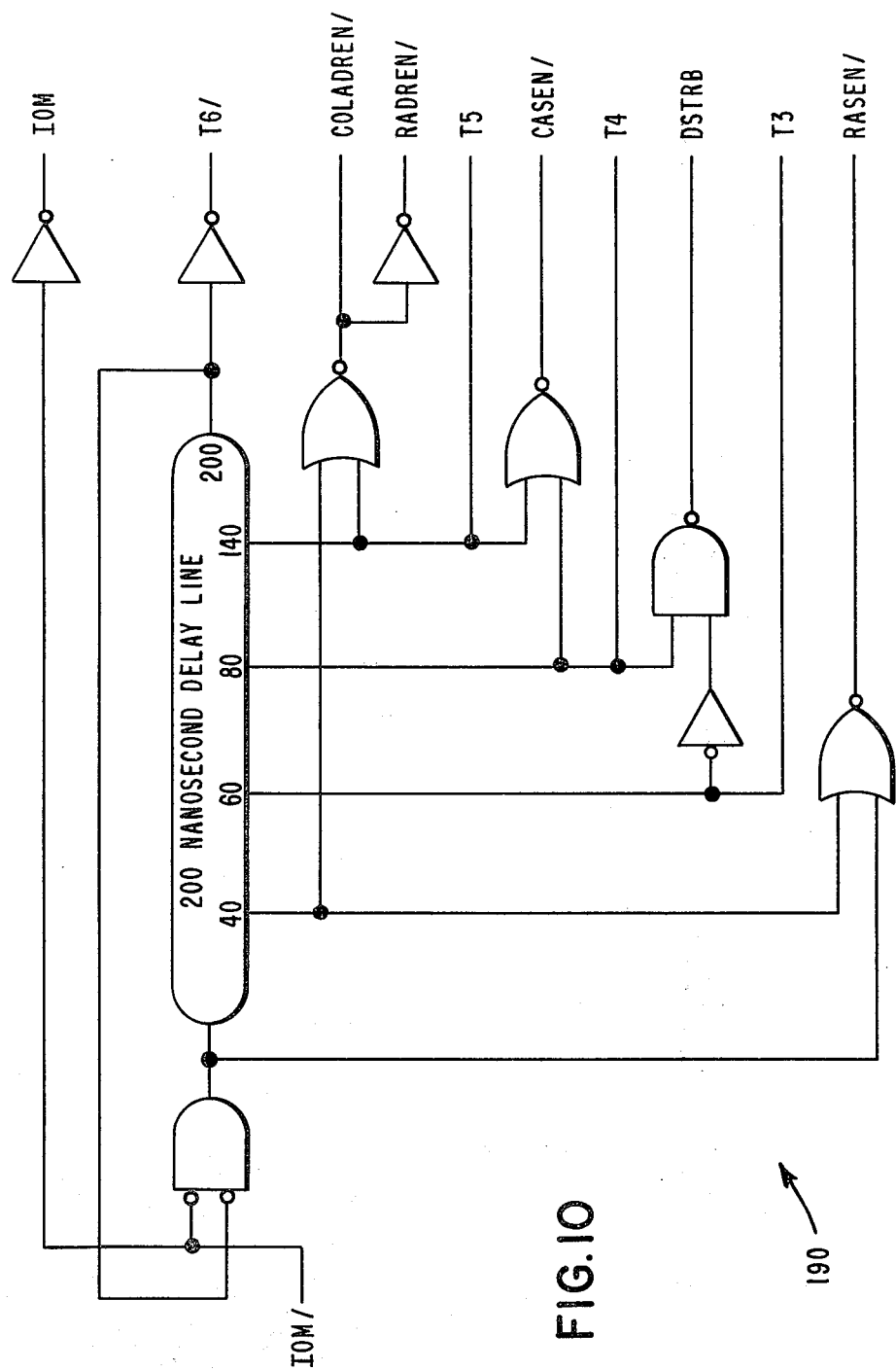
FIG. 10 is a detailed circuit diagram of timing and control circuitry for generating various signals used in the circuitry of FIGS. 5A-9B.

FIG. 10 illustrates circuitry 190 for generating various timing and control signals used in the circuitry shown in FIGS. 5A–9B. In particular, the circuitry 190 receives the inverted input-output-memory signal IOM/ from the CPU and generates the signals IOM, T6/, COLADREN/, RADREN/, T5, CASEN/, T4, DSTRB/, T3 and RASEN/.

FIGS. 11A, 11B, 11C and 11D are timing diagrams showing the signals or bits BA0–BA17, WRT/, MA0–MA15, IOM/, NODER/, RD0–RD7, BITIN, RASEN/, T3, T4, CASEN/, CASA/-CASD/, BITOUT, T5, BYTCSA/-BYTCSD/, COLADREN/, RADREN/, AA0–AA6, T6/, D0/–D7/, and DSTRB/ in order to illustrate the operation of the circuitry of FIGS. 5A–10. In particular, FIG. 11A shows all of the above signals during a memory write cycle when there is a single bit error. In FIG. 11B, only the signals or bits IOM/, RD0–RD7, BITIN, BITOUT, CASEN/, DSTRB/, D0/–D7/ and WRT/ are shown during a memory read cycle when there is a single bit error, with the other signals not shown since they would appear the same as shown in FIG. 11A. In FIG. 11C, only the signals or bits IOM/, WRT/, RD0–RD7, T5, BYTCSA/-BYTCSD/ and D0–D7 are shown during a memory write cycle when there are multiple bit errors, with the other signals not shown since they would appear the same as shown in FIG. 11A. In FIG. 11D, only the signals or bits IOM/, WRT/, T5, BYTCSA/-BYTCSD/, RD0-RD7, DSTRB/ and D0-D7/ are shown during a memory read cycle with multiple bit errors, with the other signals not shown since they would appear the same as shown in FIG. 11A.

Although a presently preferred embodiment of this invention has been described, it will be understood that within the purview of this invention various changes may be made within the scope of the appended claims.

| LOC | OBJ | LINE | SOURCE STATEMENT | | | |
|---|---|---|---|---|---|---|
| | | 1 | ;THIS PROGRAM SETS THE MAX. TO INIT. | | | |
| | | 2 | ;256K BYTES OF FAULT TOLERANT RAM. | | | |
| | | 3 | | | | |
| | | 4 | | | | |
| 0800 | | 5 | | ORG | 800H | |
| 0800 | 21FF45 | 6 | SMAX: | LXI | H,45FFH | ;LOAD H&L WITH STARTING |
| 0803 | E5 | 7 | HERE: | PUSH | H | ;ADDRESS AND SAVE |
| 0804 | 7C | 8 | | MOV | A,H | ;256K DONE? |
| 0805 | FE44 | 9 | | CPI | 44H | |
| 0807 | CA1A08 | 10 | | JZ | STOP | ;IF YES THEN END |
| 080A | 0E04 | 11 | | MVI | C,04H | ;SET UP FOR 4 4K BLOCKS |
| 080C | CD1B08 | 12 | | CALL | MLOOP | |
| 080F | CD3608 | 13 | | CALL | INTB8 | ;TEST AND MAP. |
| 0812 | E1 | 14 | | POP | H | ;RESTORE H |
| 0813 | 11F0FF | 15 | | LXI | D,0FF0H | |
| 0816 | 19 | 16 | | DAD | D | ;ADD 2'S COMP OF 0010H |
| 0817 | C30308 | 17 | | JMP | HERE | ;TO H&L REG. |
| 081A | 00 | 18 | STOP: | NOP | | |
| 081B | 3E05 | 19 | MLOOP: | MVI | A,05H | |
| 081D | 3204FC | 20 | | STA | 0FC04H | |
| 0820 | 77 | 21 | | MOV | M,A | |
| 0821 | 7C | 22 | | MOV | A,H | |
| 0822 | C610 | 23 | | ADI | 10H | |
| 0824 | 67 | 24 | | MOV | H,A | |
| 0825 | 7D | 25 | | MOV | A,L | |
| 0826 | D604 | 26 | | SUI | 04H | |
| 0828 | 6F | 27 | | MOV | L,A | |
| 0829 | 0D | 28 | | DCR | C | |
| 082A | C21B08 | 29 | | JNZ | MLOOP | |
| 082D | 0604 | 30 | | MVI | B,04H | |
| 082F | 3E05 | 31 | | MVI | A,05H | |
| 0831 | 3204FC | 32 | | STA | 0FC04H | |
| 0834 | 02 | 33 | | STAX | B | |
| 0835 | C9 | 34 | | RET | | |
| | | 35 | ;THIS PROGRAM INITIALIZES THE "B8" MAP | | | |
| | | 36 | ; FOR LOGICAL 4000H TO 7FFFH | | | |
| | | 37 | | | | |
| 0836 | 3EE0 | 38 | INTB8: | MVI | A,0E0H | |
| 0838 | 32FEFF | 39 | | STA | 0FFFEH | |
| 083B | 01AA55 | 40 | | LXI | B,55AAH | ; LOAD TEST PATTERNS |
| 083E | CD2B09 | 41 | | CALL | WRITE | ; WRITE TEST PAT. TO MEMORY |
| 0841 | 210040 | 42 | | LXI | H,4000H | ; PREPARE TO TEST ROWS. |
| 0844 | 7D | 43 | NEXTRW: | MOV | A,L | ; HAVE ALL ROWS BEEN TESTED |
| 0845 | FE80 | 44 | | CPI | 80H | ; WITH THE TEST PAT. WRITEN |
| 0847 | CA6C08 | 45 | | JZ | SNDTST | ; IF YES GO DO SECOND TEST |
| 084A | E601 | 46 | | ANI | 01H | ; IS ADD. OF ROW EVEN? |
| 084C | CA5408 | 47 | | JZ | EVEN | ; YES THEN GO EVEN |
| 084F | 0EAA | 48 | | MVI | C,0AAH | ; NO THEN LOAD ODD. PAT. |
| 0851 | C35608 | 49 | | JMP | READ1 | |
| 0854 | 0E55 | 50 | EVEN: | MVI | C,55H | ; LOAD EVEN PAT. |
| 0856 | CD6309 | 51 | READ1: | CALL | READ | ; IF NO THEN READ NEXT ROW |
| 0859 | CD7709 | 52 | | CALL | ERROR? | ; HANDLE ERROR VECTOR |
| 085C | 47 | 53 | | MOV | B,A | ; SAVE SUB. DATA |
| 085D | 3EB8 | 54 | | MVI | A,0B8H | ; SET TO "B8" MAP MODE |
| 085F | 32FEFF | 55 | | STA | 0FFFEH | |
| 0862 | 70 | 56 | | MOV | M,B | ; STORE SUB. DATA IN "B8" MAP |
| 0863 | 2C | 57 | | INR | L | ; INC. TO NEXT ROW |
| 0864 | 3EE0 | 58 | | MVI | A,0E0H | ; GET BACK IN "E0" MODE |
| 0866 | 32FEFF | 59 | | STA | 0FFFEH | |
| 0869 | C34408 | 60 | | JMP | NEXTRW | |
| 086C | 0155AA | 61 | SNDTST: | LXI | B,0AA55H | ; LOAD 2ND TEST PAT. |
| 086F | CD2B09 | 62 | | CALL | WRITE | ; WRITE 2ND TEST PAT. TO MEMORY |
| 0872 | 210040 | 63 | | LXI | H,4000H | ; PREPARE TO TEST ROWS |
| 0875 | 7D | 64 | NXTRWC: | MOV | A,L | ; HAVE ALL ROWS BEEN TESTED |
| 0876 | FE80 | 65 | | CPI | 80H | ; IF YES GO DO "F8" MAP. |
| 0878 | CAC108 | 66 | | JZ | INTF8 | |
| 087B | E601 | 67 | | ANI | 01H | |
| 087D | C28508 | 68 | | JNZ | ODD | ; IF ODD ROW GO LOAD ODD PAT. |
| 0880 | 0EAA | 69 | | MVI | C,0AAH | ; EVEN LOAD EVEN PAT. |
| 0882 | C38708 | 70 | | JMP | READ2 | |
| 0885 | 0E55 | 71 | ODD: | MVI | C,55H | |
| 0887 | CD6309 | 72 | READ2: | CALL | READ | ; IF NO CHECK NEXT ROW |

-continued

| LOC | OBJ | LINE | SOURCE STATEMENT | | | |
|---|---|---|---|---|---|---|
| 088A | CD7709 | 73 | | CALL | ERROR? | ; HANDLE ERROR VECTOR |
| 088D | 47 | 74 | | MOV | B,A | ; SAVE SUB. INFO. |
| 088E | 3EB8 | 75 | | MVI | A,0B8H | ; SELECT "B8" MODE. |
| 0890 | 32FEFF | 76 | | STA | 0FFFEH | |
| 0893 | 7E | 77 | | MOV | A,M | ; GET RESULT OF FIRST TEST. |
| 0894 | B8 | 78 | | CMP | B | ; ARE RESULTS OF 1ST=2ND. |
| 0895 | CAB808 | 79 | | JZ | NOCHG | ; IF YES THEN NOCHG. TO "B8" |
| 0898 | 78 | 80 | | MOV | A,B | ; IS RESULT OF 2ND=0FH |
| 0899 | FE0F | 81 | | CPI | 0FH | |
| 089B | CAB808 | 82 | | JZ | NOCHG | ; IF YES THEN NOCHG. TO "B8" . |
| 089E | FE08 | 83 | | CPI | 08H | ; WAS RESULT=08H |
| 08A0 | C2A708 | 84 | | JNZ | NOT08 | ; IF NOT THEN COMPARE BIT SUBS. |
| 08A3 | 77 | 85 | | MOV | M,A | ; IF YES THEN WRT. 08 TO "B8" |
| 08A4 | C3B808 | 86 | | JMP | NOCHG | |
| 08A7 | 7E | 87 | NOT0B: | MOV | A,M | ; GET SUB. INFO. FROM "B8" |
| 08A8 | FE08 | 88 | | CPI | 08H | ; WAS RESULT OF 2ND.=08 |
| 08AA | CAB808 | 89 | | JZ | NOCHG | ; IF SO THEN NOCHG. TO "B8" |
| 08AD | FE0F | 90 | | CPI | 0FH | ; IF MAP HAS X0H |
| 08AF | C2B608 | 91 | | JNZ | BYTE | ; THEN BYTE SUB. IS REQUIRED |
| 08B2 | 70 | 92 | | MOV | M,B | ; IF IT WAS 0FH THEN BIT INFO. |
| 08B3 | C3B808 | 93 | | JMP | NOCHG | ; MUST BE WRITEN TO "B8" MAP. |
| 08B6 | 3608 | 94 | BYTE: | MVI | M,08H | ; MAKE BYTE SUB. |
| 08B8 | 2C | 95 | NOCHG: | INR | L | ; INC. ROW TO BE CHECKED |
| 08B9 | 3EE0 | 96 | | MVI | A,0E0H | ; SELECT "E0" MODE. |
| 08BB | 32FEFF | 97 | | STA | 0FFFEH | |
| 08BE | C37508 | 98 | | JMP | NXTRWC | |
| | | 99 | ;THIS PROGRAM IS TO INITIALIZE THE "F8" | | | |
| | | 100 | ;MAP. IT IS ASSUMED THAT THE NEXT AVAILABLE BIT | | | |
| | | 101 | ;AND BYTE ADD. ARE STORED IN OBM LOC. | | | |
| | | 102 | ;3F40 TO 3F43. | | | |
| | | 103 | | | | |
| | | 104 | | | | |
| 08C1 | 210040 | 105 | INTF8: | LXI | H,4000H | |
| 08C4 | 7D | 106 | FNXTRW: | MOV | A,L | ;HAVE ALL "F8" ROWS |
| 08C5 | FE80 | 107 | | CPI | 80H | ;BEEN CHECKED |
| 08C7 | C8 | 108 | | RZ | | ;IF SO RETURN |
| 08C8 | 3EB8 | 109 | | MVI | A,0B8H | ;SELECT "B8" MODE |
| 08CA | 32FEFF | 110 | | STA | 0FFFEH | |
| 08CD | 7E | 111 | | MOV | A,M | ;FETCH "B8" DATA. |
| 08CE | FE0F | 112 | | CPI | 0FH | ;IS IT NOSUB. |
| 08D0 | CA2609 | 113 | | JZ | INCRW | ;IF YES GO DO NEXT ROW. |
| 08D3 | FE08 | 114 | | CPI | 08H | ;IS IT BYTE SUB. |
| 08D5 | CAFE08 | 115 | | JZ | FBYTE | ;IF SO GO DO BYTE ADD. |
| 08D8 | 3A403F | 116 | | LDA | HBIT | ;IF BIT DO BIT ADD. |
| 08DB | B6 | 117 | | ORA | M | ;COMB. BIT INFO. WITH CS. |
| 08DC | 77 | 118 | | MOV | M,A | ;WRT. IF TO "B8" MAP. |
| 08DD | 3EF8 | 119 | | MVI | A,0F8H | ;SEL. "F8" MAP MODE. |
| 08DF | 32FEFF | 120 | | STA | 0FFFEH | |
| 08E2 | 3A413F | 121 | | LDA | LBIT | ;FETCH LOW BIT ADD. |
| 08E5 | 77 | 122 | | MOV | M,A | ;AND WRT. IT TO "F8" |
| 08E6 | 3C | 123 | | INR | A | ;INC. TO NEXT AVAILABLE BIT |
| 08E7 | 32413F | 124 | | STA | LBIT | ;ADD. AND STORE. |
| 08EA | FE80 | 125 | | CPI | 80H | ;SHOULD C.S. BE INC. |
| 08EC | C22609 | 126 | | JNZ | INCRW | ;NO? GO DO NEXT ROW. |
| 08EF | 3E00 | 127 | | MVI | A,00H | ;YES? CLEAR LOW BIT ADD. |
| 08F1 | 32413F | 128 | | STA | LBIT | |
| 08F4 | 3A403F | 129 | | LDA | HBIT | ;FETCH AND INC. BIT C.S. |
| 08F7 | 3C | 130 | | INR | A | |
| 08F8 | 32403F | 131 | | STA | HBIT | |
| 08FB | C32609 | 132 | | JMP | INCRW | |
| 08FE | 3A423F | 133 | FBYTE: | LDA | HBYTE | |
| 0901 | B6 | 134 | | ORA | M | ;COMB. BYTE C.S. WITH 08H |
| 0902 | 77 | 135 | MOV | M,A | ;WRT. TO "B8" | |
| 0903 | 3EF8 | 136 | | MVI | A,0F8H | ;SELECT "F8" MAP. |
| 0905 | 32FEFF | 137 | | STA | 0FFFEH | |
| 0908 | 3A433F | 138 | | LDA | LBYTE | ;FETCH LOW BYTE ADD. |
| 090B | 77 | 139 | | MOV | M,A | ;AND WRT. IT TO "F8" |
| 090C | 3C | 140 | | INR | A | ;INC. TO NEXT ADD. |
| 090D | 32433F | 141 | | STA | LBYTE | ;SAVE NEW LOW BYTE |
| 0910 | FE08 | 142 | | CPI | 08H | ;DOES C.S. NEED INC. |
| 0912 | C22609 | 143 | | JNZ | INCRW | ;NO? GO DO NEXT ROW |
| 0915 | 3E00 | 144 | | MVI | A,00H | ;YES? CLEAR LOW BYTE ADD. |
| 0917 | 32433F | 145 | | STA | LBYTE | |
| 091A | 3A423F | 146 | | LDA | HBYTE | ;GET AND INC. BYTE C.S. |
| 091D | 3C | 147 | | INR | A | |
| 091E | 32423F | 148 | | STA | HBYTE | |
| 0921 | FE04 | 149 | | CPI | 04H | ;BYTE SPARE OVERFLOW |
| 0923 | CA2A09 | 150 | | JZ | BYTVF | ;IF YES THEN ERROR????? |
| 0926 | 23 | 151 | INCRW: | INX | H | ;INC. TO NEXT ROW. |

-continued

| LOC | OBJ | LINE | SOURCE STATEMENT | | | |
|---|---|---|---|---|---|---|
| 0927 | C3C408 | 152 | | JMP | FNXTRW | |
| 092A | 76 | 153 | BYTVF: | HLT | | |
| 3F40 | | 154 | HBIT | EQU | 3F40H | |
| 3F41 | | 155 | LBIT | EQU | 3F41H | |
| 3F42 | | 156 | HBYTE | EQU | 3F42H | |
| 3F43 | | 157 | LBYTE | EQU | 3F43H | |
| | | 158 | | | | |
| | | 159 | | | | |
| | | 160 | | | | |
| | | 161 | | | | |
| | | 162 | ;THIS PROGRAM WRITES TO MEMORY IN THE | | | |
| | | 163 | ;PATTERN SUGGESTED BY NATIONAL. IT WRITES LOGICAL | | | |
| | | 164 | ;4000H to 7FFFH. | | | |
| | | 165 | ;THE REG. USED ARE H&L, D&E, B&C, AND ACC. | | | |
| | | 166 | ;THE TEST PATTERNS ARE STORED IN B&C WITH | | | |
| | | 167 | ;THE FIRST PATTERN IN B AND 2ND IN C. | | | |
| | | 168 | | | | |
| | | 169 | | | | |
| 092B | 210040 | 170 | WRITE: | LXI | H,4000H | |
| 092E | 110110 | 171 | | LXI | D,1001H | |
| 0931 | 1B | 172 | WRT: | DCX | D | ;CHECK TO SEE IF ALL LOC. |
| 0932 | 3E00 | 173 | | MVI | A,00H | ;HAVE BEEN WRITEN THE L REG. |
| 0934 | BA | 174 | | CMP | D | |
| 0935 | C23C09 | 175 | | JNZ | NEXT | |
| 0938 | BB | 176 | | CMP | E | |
| 0939 | CA5609 | 177 | | JZ | CONT | |
| 093C | 70 | 178 | NEXT: | MOV | M,B | ;WRITE TO TEST LOC. |
| 093D | 7D | 179 | | MOV | A,L | |
| 093E | 2F | 180 | | CMA | | ;COMPLEMENT THE L REG. |
| 093F | 6F | 181 | | MOV | L,A | |
| 0940 | 7C | 182 | | MOV | A,H | |
| 0941 | 2F | 183 | | CMA | | ;COMPLEMENT THE H REG. |
| 0942 | E63F | 184 | | ANI | 3FH | ;RESTORE TO 4000H TO 7FFFH |
| 0944 | C640 | 185 | | ADI | 40H | ;RANGE |
| 0946 | 67 | 186 | | MOV | H,A | |
| 0947 | 71 | 187 | | MOV | M,C | ;WRITE TO NEXT TEST LOC. |
| 0948 | 7C | 188 | | MOV | A,H | ;CHECK WHETHER TO INC. OR DEC. H |
| 0949 | E620 | 189 | | ANI | 20H | ;IF A12=1 THEN DEC. H REG. |
| 094B | CA5209 | 190 | | JZ | INC | ;IF A12=0 THEN INC. H REG. |
| 094E | 2B | 191 | | DCX | H | ;ADJUST H&L DOWN |
| 094F | C33109 | 192 | | JMP | WRT | ;CONT. WRITING |
| 0952 | 23 | 193 | INC: | INX | H | ;ADJUST H&L UP |
| 0953 | C33109 | 194 | | JMP | WRT | ;CONT. WRITING |
| 0956 | 3E60 | 195 | CONT: | MVI | A,60H | ;CHECK TO SEE IF OVER HUMP |
| 0958 | BC | 196 | | CMP | H | |
| 0959 | CA6209 | 197 | | JZ | RETURN | ;IF SO RETURN |
| 095C | 110110 | 198 | | LXI | D,1001H | ;IF NOT RESET D&E REG. |
| 095F | C33109 | 199 | | JMP | WRT | ;AND CONT. WRITING |
| 0962 | C9 | 200 | RETURN: | RET | | |
| | | 201 | ;THIS PROGRAM CHECKS AN ENTIRE ROW LOOKING FOR THE TEST PATTERN WRITEN TO | | | |
| | | 202 | ;EVERY LOCATION. IT FORMS AN ERROR VECTOR WHICH IS IN ACC. UPON RETURN. | | | |
| | | 203 | ;THE ADD. OF THE ROW TO BE CHECKED IS IN THE L REG. WHICH IS NOT DESTROYED. | | | |
| | | 204 | ;REG. USED ARE H & L, D & E, B & C, AND ACC. | | | |
| | | 205 | ;THE PATTERN TO CHECK THIS ROW FOR IS IN C REG. | | | |
| | | 206 | | | | |
| | | 207 | | | | |
| 0963 | 2640 | 208 | READ: | MVI | H,40H | ;SET H FOR STARTING RANGE |
| 0965 | 1180000 | 209 | | LXI | D,0080H | ;LOAD D TO INC H & L BY COL. |
| 0968 | 0600 | 210 | | MVI | B,00H | ;CLEAR ERROR VECTOR STORAGE |
| 096A | 7E | 211 | TEST: | MOV | A,M | ;FETCH TEST DATA |
| 096B | A9 | 212 | | XRA | C | ;COMPARE TO C REG. |
| 096C | B0 | 213 | | ORA | B | ;COMBINE ERROR VECTORS |
| 096D | 47 | 214 | | MOV | B,A | ;SAVE ERROR VECTOR |
| 096E | 19 | 215 | | DAD | D | ;INC. TO NEXT COL. |
| 096F | 7C | 216 | | MOV | A,H | ;SEE IF ALL COL. CHECKED |
| 0970 | FE80 | 217 | | CPI | 80H | ;THAT HAVE THIS ROW ADD. |
| 0972 | C26A09 | 218 | | JNZ | TEST | ;IF NOT CONT. TESTING |
| 0975 | 78 | 219 | | MOV | A,B | ;PUT ERROR VECTOR IN ACC. |
| 0976 | C9 | 220 | | RET | | |
| | | 221 | ;THIS PROGRAM CONVERTS THE ERROR VECTOR IN THE ACC. | | | |
| | | 222 | ;TO ITS PROPER VALUE TO INDICATE THE TYPE OF SUBSTITUTION | | | |
| | | 223 | ;REQUIRED. THE DATA IS IN THE ACC. ON RET. | | | |
| | | 224 | ;REG. USED D&E, B&C, AND ACC. THE H & L REG. ARE NOT AFFECTED | | | |
| | | 225 | | | | |
| | | 226 | | | | |
| 0977 | 2640 | 227 | ERROR?: | MVI | H,40H | |
| 0979 | FE00 | 228 | | CPI | 00H | ;ARE THERE ANY ERRORS |
| 097B | C28109 | 229 | | JNZ | YES | ;IF YES GO FIND WHERE |
| 097E | 3E0F | 230 | | MVI | A,0FH | ;IF NO THEN ACC.=0FH |
| 0980 | C9 | 231 | | RET | | ;AND RETURN |

-continued

| LOC | OBJ | LINE | SOURCE STATEMENT | | | |
|---|---|---|---|---|---|---|
| 0981 | 0600 | 232 | YES: | MVI | B,00H | ;CLEAR DIGIT COUNTER |
| 0983 | 0E00 | 233 | | MVI | C,00H | ;CLEAR ERROR COUNTER |
| 0985 | 37 | 234 | | STC | | ;CLEAR CARRY |
| 0986 | 3F | 235 | | CMC | | |
| 0987 | 1F | 236 | CHECK: | RAR | | ;MOVE ERROR BIT TO CARRY |
| 0988 | D28D09 | 237 | | JNC | NOTERR | ;IF NOT ERROR GO INC DIGIT |
| 098B | 0C | 238 | | INR | C | ;IF ERROR INC ERROR CNTR. |
| 098C | 58 | 239 | | MOV | E,B | ;SAVE DIGIT IN ERROR# |
| 098D | 04 | 240 | NOTERR: | INR | B | ;INC DIGIT COUNTER |
| 098E | 57 | 241 | | MOV | D,A | ;SAVE REST OF ERROR VECTOR |
| 098F | 78 | 242 | | MOV | A,B | ;CHECK TO SEE IF ALL BITS |
| 0990 | FE08 | 243 | | CPI | 08H | ;HAVE BEEN CHECKED |
| 0992 | CA9909 | 244 | | JZ | ALLCHK | ;IF SO HOW MANY ERRORS? |
| 0995 | 7A | 245 | | MOV | A,D | ;RESTORE ERROR VECTOR |
| 0996 | C38709 | 246 | | JMP | CHECK | ;CONT. CHECKING |
| 0999 | 79 | 247 | ALLCHK: | MOV | A,C | ;GET ERROR CNTR. IN ACC. |
| 099A | FE01 | 248 | | CPI | 01H | ;ONE ERROR ? |
| 099C | CAA209 | 249 | | JZ | BITERR | ;IF ONLY ONE THEN BIT ERROR |
| 099F | 3E08 | 250 | | MVI | A,08H | ;IF MORE THAN ONE THEN BYTE |
| 09A1 | C9 | 251 | | RET | | |
| 09A2 | 7B | 252 | BITERR: | MOV | A,E | ;IF BIT GET BIT NUMBER |
| 09A3 | 07 | 253 | | RLC | | |
| 09A4 | 07 | 254 | | RLC | | |
| 09A5 | 07 | 255 | | RLC | | |
| 09A6 | 07 | 256 | | RLC | | ;MOVE BIT NUMBER TO UPPER BITS |
| 09A7 | C9 | 257 | | RET | | |
| | | 258 | | END | | |

I claim:

1. A memory system, comprising:

a primary memory having a plurality of addressable memory locations each of which has memory cells for storing a primary group of data bits, with some of the memory cells of the primary memory being defective;

an alternate memory for storing replacement data bits to replace any data bits stored in said primary memory at locations having a defective memory cell, said alternate memory including a first alternate memory portion having a plurality of addressable memory locations each of which is for storing a first alternate group of bits, and a second alternate memory portion having a plurality of addressable memory locations each of which is for storing second alternate groups of bits, where each first alternate group of bits consists of a first predetermined number of bits and each second alternate group of bits consists of a second predetermined number of bits, and where said first predetermined number is greater than said second predetermined number; and means for replacing bits in the primary groups of bits read from locations in said primary memory having a defective memory cell with bits from the first and second alternate groups of bits, so that bits in the primary groups from locations having more than said second predetermined number of defective bit cells are replaced with bits from the first alternate groups of bits and bits in the primary groups from other locations having defective bit cells are replaced with bits from the second alternate groups of bits.

2. The memory system of claim 1, wherein each said second alternate group is a single bit, and wherein said means for replacing comprises means for replacing a single bit in any primary group read from a location having a single defective memory cell with one said second alternate group.

3. The memory system of claim 2, wherein each location of said primary memory stores a byte of data bits, wherein each first alternate group of bits is a byte of data, and wherein said means for replacing further comprises means for replacing the entire primary group of bits from any location in said primary memory having multiple defective memory cells with one of said first alternate groups of bits.

4. The memory system of claim 3, wherein said memory system further comprises a mapping memory for storing bits associated with each of said locations in said primary memory having at least one defective memory cell for addressing one of said first and second alternate memory portions for replacing bits in the primary group of data bits stored at the location having at least one defective memory cell.

5. The memory system of claim 4, wherein said means for replacing the bits in the primary group of bits from said location having a single defective memory cell comprises a bit substitution circuit for receiving the primary group of bits having the single defective memory cell from said primary memory and for receiving the bit of one of said second groups of bits from said second alternate memory portion, and for substituting the bit in the primary group stored at the defective memory cell with the bit from said second alternate memory portion.

6. The memory system of claim 3, wherein said means for replacing includes a mapping memory for storing control bits associated with each of said locations having at least one defective memory cell, wherein said primary memory includes a plurality of memory devices for each storing a single bit at a location defined by addressable rows and columns, with each memory device having defective memory cells that are either in all the memory cells in any one of the columns or in all of the memory cells in any one of the rows, so that the alternate memory may be addressed by the control bits from said mapping memory and a portion of the address bits used to address one of the locations in said primary memory.

7. In a data processing system having a primary memory with a plurality of addressable memory locations, each memory location for storing a primary group of data bits, and an alternate memory for storing data bits to replace data bits in the primary groups of data bits of said primary memory that are stored in said primary locations having defective memory cells, the improvement wherein said alternate memory comprises:

- a first alternate memory portion for storing data bits in first groups; and
- a second alternate memory portion for storing data bits in second groups, each of said second groups having at least one bit but having a number of bits less than the number of bits in each said first group, so that said first groups are used to replace bits in those primary groups of bits stored at each location having a greater number of defective memory cells than the number of data bits in any of said second groups, and so that said second groups are used to replace bits in those primary groups of bits stored at locations having a number of defective memory cells which is the same or less than the number of data bits in any of said second groups.

8. A memory system, comprising:

- a primary memory having a plurality of addressable locations, each location for storing a primary group of data bits, with at least some of said locations having at least one defective memory cell;
- an alternate memory for storing replacement data bits for any primary group of data bits stored in said primary memory at said locations having a defective memory cell, said alternate memory including a first alternate memory portion for storing first alternate groups of bits and a second alternate memory portion for storing second alternate groups of bits, with each of the first alternate groups having a first predetermined number of bits and each of the second alternate groups of bits having a second predetermined number of bits less than the first predetermined number; and
- means for replacing bits in the primary groups of bits read from said locations in said primary memory having defective memory cells with the second alternate groups of bits when said locations have the same or a lesser number of defective cells than the second predetermined number, and replacing the bits in the primary groups of bits read from said locations in said primary memory having defective cells with the first alternate groups of bits when said locations have a number of defective cells greater than the second predetermined number.

9. The memory system of claim 8, wherein the primary number of bits in each primary group is the same as the first predetermined number in the first alternate group, so that when the number of defective cells is greater than the second predetermined number, all of the bits in the primary group are replaced.

10. The memory system of claim 9 wherein each location of said primary memory stores a byte of data bits, wherein the first predetermined number of bits in each of the first alternate groups is a byte of data bits, and wherein the second predetermined number of bits in each of the second alternate groups is a single bit.

11. In a memory system of the type having a primary memory with a plurality of memory devices, each memory device having data bits stored at memory cells in addressable rows and columns, and with at least some of the memory devices having defective memory cells, having an alternate memory for storing data bits to be substituted for the data bits stored at the defective memory cells in the primary memory, and having a mapping memory for storing control bits to address one or more bits in the alternate memory that are to replace the bits stored at defective memory cells in the primary memory, the improvement wherein each memory device at said primary memory has defective memory cells that are either in all of the memory cells in any one of the addressable columns of in all of the memory cells in any one of the addressable rows, so that only a portion of the bits needed to address the alternate memory comes from the mapping memory, with the remaining number of bits needed to address the alternate memory coming from the address bits used to address the primary memory.

12. A method for reducing the amount of memory space needed in an alternate memory to store data bits used to replace data bits stored at defective memory cells in an associated primary memory, the method comprising:

- providing a byte memory in said alternate memory, said byte memory having a plurality of addressable locations for each storing a byte of data;
- providing a bit memory in said alternate memory, said bit memory having a plurality of addressable locations each storing a single bit; and
- replacing the bits stored at locations in the primary memory having defective memory cells so that when multiple bits in each byte from the primary memory are stored at defective cells, the entire byte from the primary memory is replaced by a byte from the byte memory, and when only a single bit from a byte at the primary memory is stored at a defective memory cell, only the single bit is replaced by a bit from the bit memory.

* * * * *